(12) United States Patent
Sugaya et al.

(10) Patent No.: US 6,931,725 B2
(45) Date of Patent: Aug. 23, 2005

(54) CIRCUIT COMPONENT BUILT-IN MODULE, RADIO DEVICE HAVING THE SAME, AND METHOD FOR PRODUCING THE SAME

(75) Inventors: Yasuhiro Sugaya, Osaka (JP); Koichi Hirano, Hirakata (JP); Seiichi Nakatani, Hirakata (JP); Yasuyuki Matsuoka, Neyagawa (JP); Satoru Yuuhaku, Osaka (JP); Toshiyuki Asahi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 407 days.

(21) Appl. No.: 10/340,170

(22) Filed: Jan. 9, 2003

(65) Prior Publication Data

US 2003/0141105 A1 Jul. 31, 2003

Related U.S. Application Data

(62) Division of application No. 09/738,522, filed on Dec. 15, 2000, now Pat. No. 6,538,210.

(30) Foreign Application Priority Data

Dec. 20, 1999 (JP) .......................................... 11-361735

(51) Int. Cl.[7] ................................................. H01K 3/10
(52) U.S. Cl. .............................. 29/852; 29/832; 29/840
(58) Field of Search ............................ 29/832, 840, 852

(56) References Cited

U.S. PATENT DOCUMENTS

| | | | |
|---|---|---|---|
| 4,697,203 A | 9/1987 | Sakai et al. | |
| 5,346,750 A | 9/1994 | Hatakeyama et al. | |
| 5,821,456 A | 10/1998 | Wille et al. | |
| 6,038,133 A | * | 3/2000 | Nakatani et al. ............ 361/760 |
| 6,350,952 B1 | 2/2002 | Gaku et al. | |
| 6,538,210 B2 | * | 3/2003 | Sugaya et al. .............. 174/258 |
| 6,569,512 B2 | * | 5/2003 | Takezawa et al. .......... 428/209 |

FOREIGN PATENT DOCUMENTS

| | | |
|---|---|---|
| JP | 64-47991 | 2/1988 |
| JP | 5-259372 | 10/1993 |
| JP | 6-268345 | 8/1994 |
| JP | 8-195414 | 7/1996 |
| JP | 10-74858 | 3/1998 |
| JP | 11-87424 | 3/1999 |
| JP | 11-103147 | 4/1999 |
| JP | 11-163249 | 6/1999 |
| JP | 11-220262 | 8/1999 |
| JP | 11-312868 | 11/1999 |

* cited by examiner

*Primary Examiner*—Carl J. Arbes
(74) *Attorney, Agent, or Firm*—Mueller & Larson P.C.

(57) ABSTRACT

A circuit component built-in module capable of mounting the circuit component with high density and having high heat releasing property and the high reliability. The circuit component built-in module 100 includes the insulating substrate 101 made of a first mixture 105 and a second mixture 106, wiring patterns 102a and 102b formed on one principal surface and another principal surface of the insulating substrate 101, a circuit component 103a electrically connected to the wiring pattern 102a and sealed with the second mixture 106 in an internal portion of the insulating substrate 101, the inner via conductor 104 electrically connecting the wiring pattern 102a and 102b.

31 Claims, 15 Drawing Sheets

FIG. 5A
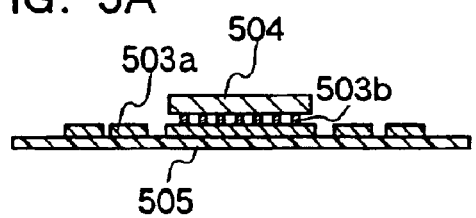
FIG. 5C
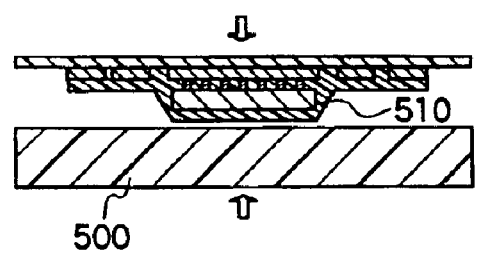
FIG. 5B
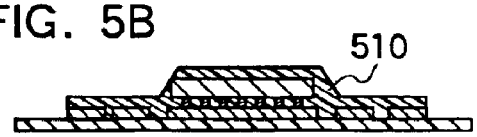
FIG. 5E
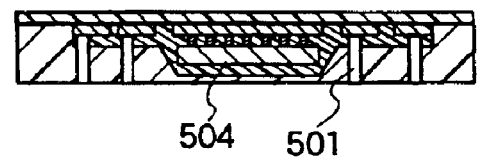
FIG. 5D
FIG. 5F
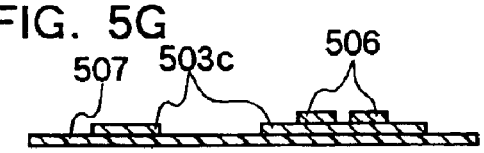
FIG. 5G
FIG. 5I
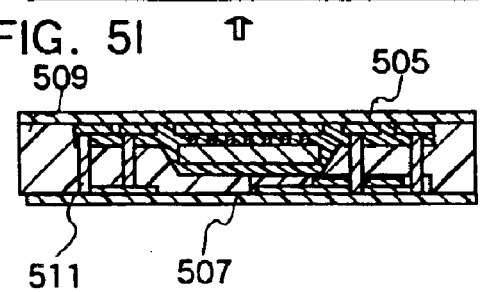
FIG. 5H
FIG. 5J

FIG. 8A
FIG. 8B
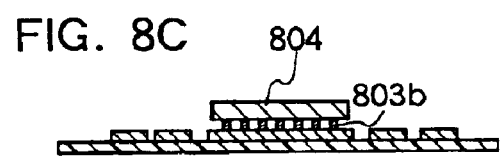
FIG. 8C
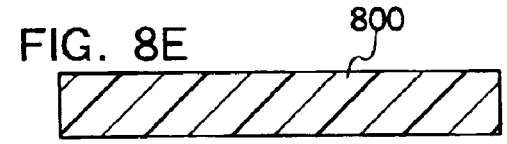
FIG. 8E
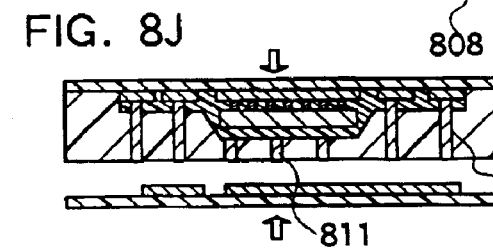
FIG. 8H
FIG. 8J
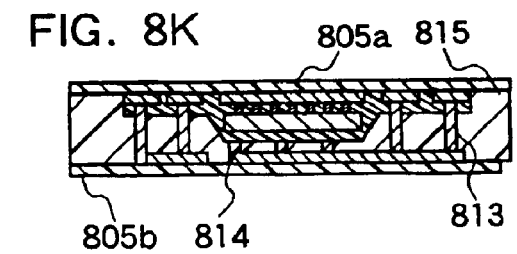
FIG. 8K
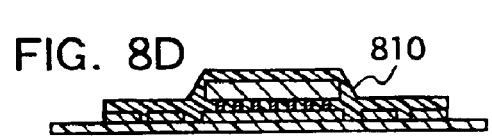
FIG. 8D
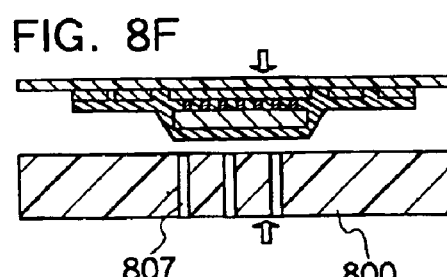
FIG. 8F
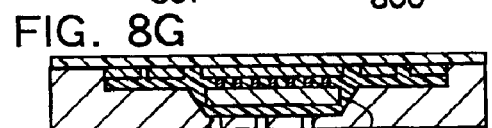
FIG. 8G
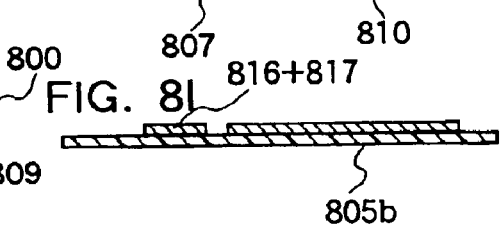
FIG. 8I
FIG. 8L

CIRCUIT COMPONENT BUILT-IN MODULE, RADIO DEVICE HAVING THE SAME, AND METHOD FOR PRODUCING THE SAME

BACKGROUND OF THE INVENTION

1. Field of the Invention

The present invention relates to a circuit component built-in module and a method for producing the same. In particular, the present invention relates to a circuit component built-in module in which, for example, a circuit component is placed in an internal portion of an insulating substrate and a method for producing the same.

2. Related Background Art

In recent years, with the demand for high performance and miniaturization of electronic equipment, high density, high performance and short-distance wiring of a circuit component have been desired increasingly. Accordingly, a wiring substrate capable of including a high density, high-performance and short-distance wiring circuit component has been demanded. The formation of a multi-layer circuit may be a solution to attain a higher-density wiring substrate. However, a conventional glass-epoxy substrate requires a through-hole structure by using a drill, so that it is difficult to achieve a high density mounting. Therefore, as the most useful method for attaining a high density circuit, an inner-via-hole connection method that can connect wiring patterns between LSIs or circuit components in the shortest distance are being developed in various fields.

In the inner-via-hole connection method, only the necessary layers can be connected, and the mounting property of the circuit components is excellent (see JP63(1988)-47991A, JP6(1994)-268345A).

On the other hand, in a mounting method in which an active component such as a semiconductor chip is mounted on the surface layer of a wiring substrate, there is a limitation in attaining high density. Therefore, a mounting method of providing a substrate with a concave portion and mounting a semiconductor chip so as to be contained in the concave portion has been suggested (JP5(1993)-259372A, JP11(1999)-103147A, JP11(1999)-163249A). In this case, after the semiconductor chip is mounted in the concave portion, a sealing resin is coated so as to protect the connection portion and the semiconductor chip. Thus, sealing is performed.

However, since the substrate used in the conventional inner-via-hole connection method is formed of a resin material, it has a low thermal conductivity. Furthermore, in the circuit component built-in module, as the mounting density of the circuit substrate is higher, it is more necessary to release heat generated from the component. However, the conventional substrate cannot release heat sufficiently, thus deteriorating the reliability of the circuit component built-in module.

On the other hand, among the methods for building in a circuit component such as a semiconductor chip, in the method of providing the substrate with a concave portion so that the chip is placed therein and sealing with a sealing resin, it is necessary to perform many processes, for example, a process for forming a concave portion on the substrate, etc., which raise cost. Also, in such a method, incidence of defectiveness is increased. Furthermore, because a chip is built in, it is difficult to release heat around the chip effectively even though heat release is required. Furthermore, since the sealing resin is intervened, the property of the substrate does not have uniformity in three dimension.

If the circuit component such as a semiconductor, etc. is built in the substrate in the burying process, when the semiconductor chip is buried in the wiring pattern formed on the mold release body, a sheet flows radically and the location of the preliminarily formed via conductor may be distorted, or a wiring pattern around the chip may be disconnected or distorted. Therefore, this method has much difficulty in practice. Furthermore, there are many limitations in re-wiring in the chip built-in configuration.

Furthermore, when the mold release body is an organic film having a adhesive property, it is impossible to secure a sufficient gap for the connection portion between the wiring pattern and the semiconductor chip, and it is difficult to inject the sealing resin capable of sealing the connection portion, and thus the reliability of the connection portion cannot be obtained sufficiently.

On the other hand, in the module in which a circuit component is built in, since there is a difference in the coefficient of thermal expansion between the substrate and the circuit components, it is not possible to secure the reliability of the circuit component when the circuit component is buried.

It is an object of the present invention to provide a circuit component built-in module capable of mounting circuit components with high density, having a high heat releasing property and a high reliability and a method for producing the same.

In order to attain the above-mentioned object, the circuit component built-in module of the present invention includes an insulating substrate including a mixture of an inorganic filler and a thermosetting resin; a wiring pattern formed on at least one principal surface of the insulating substrate; and a circuit component placed in an internal portion of the insulating substrate and electrically connected to the wiring pattern; and the mixture includes a second mixture that seals at least a connection portion between the wiring pattern and the circuit component and a first mixture forming a region excluding the second mixture in the insulating substrate. In this configuration, the amount of an inorganic filler contained in the first mixture is larger than the amount of the inorganic filler contained in the second mixture.

According to the configuration of the circuit component built-in module, heat generated from the circuit component is released by the inorganic filler swiftly, so that a circuit module having high reliability can be realized. Furthermore, among the two kinds of mixtures forming the insulating substrate, the second mixture having a smaller content of an inorganic filler seals the wiring portion connecting to the circuit component, so that a highly reliable connection portion free from the disconnection can be obtained.

Furthermore, by selecting the inorganic filler, it is possible to change the thermal conductivity, coefficient of linear thermal expansion, dielectric constant, breakdown voltage or the like. Therefore, since it is possible to make the coefficient of linear thermal expansion of the insulating substrate substantially the same as that of the semiconductor device, a circuit component built-in module preferably integrates a semiconductor device. Furthermore, since it is possible to improve the thermal conductivity of the insulating substrate, the circuit component built-in module preferably includes a semiconductor device requiring the heat release. Furthermore, since it is possible to lower the dielectric constant of the insulating substrate, a circuit component built-in module for high frequency is preferably provided.

Furthermore, in the case of a circuit component built in module including a semiconductor and a chip capacitor as the circuit components, it is possible to reduce the noise of the electric signal by shortening the distance between the semiconductor chip and the chip capacitor. Furthermore, it is preferable that the wiring patterns are formed on both principal surfaces of the insulating substrate, and an inner via conductor for electrically connecting the wiring patterns on both principal surfaces is provided.

Furthermore, in general, the semiconductor chip has a problem in terms of KGD (known good die) and handling, raising the cost. However, with the circuit component built-in module of the present invention, even if the bare semiconductor chip is used as the circuit component, it is advantageous in that the quality check is carried out easily. Furthermore, re-wiring is performed easily, so that it is possible to attain various LGA electrodes having less restriction in designing.

Furthermore, it is preferable in the circuit component built-in module of the present invention that the second mixture is intervened in the boundary portion between the wiring pattern and the first mixture. According to such a preferable configuration, it is possible to prevent disconnection and distortion, when the circuit component is buried. In particular, it is advantageous when the circuit component is buried by forming a wiring pattern and circuit component on the base material such as a mold release carrier and bringing the mold release carrier into contact with the first mixture that the disconnection or distortion of the wiring pattern does not occur even if the base material such as resin film that stretches is used, because the circuit component and wiring pattern are sealed and fixed with the second mixture.

Furthermore, it is preferable in the circuit component built-in module of the present invention that the inner via conductor includes a conductive resin composition. This preferable configuration facilitates the production. In this case, it is preferable that the conductive resin composition includes one selected from the group consisting of gold, silver, copper and nickel as a conductive substance, and an epoxy resin as a resin substance. These metals have low electric resistance. Epoxy resin is excellent in thermal resistance or electric insulating property.

Furthermore, it is preferable in the circuit component built-in module of the present invention that the circuit component includes at least one active component. According to such a preferable configuration, it is possible to integrate a circuit component having a desired function.

In this case, it is further preferable that the active component includes a bare semiconductor chip, and the bare semiconductor chip is flip-chip bonded to the wiring pattern. Furthermore, it is preferable that a thermal via conductor is formed on the rear side of the bare semiconductor chip. This preferable configuration provides an insulating substrate excellent in heat releasing property, and is employed for a bare semiconductor chip that generates a large amount of heat because the heat releasing property of the bare semiconductor chip is improved.

Furthermore, it is preferable in the configuration of the circuit component built-in module of the present invention that the first mixture includes 70 weight % to 95 weight % of an inorganic filler and the second mixture includes 50 weight % to 90 weight % of an inorganic filler. According to the preferable configuration, the heat generated from the circuit component is released swiftly by the first component in which an inorganic filler is filled with high density, so that a highly reliable circuit component built-in module can be realized.

Furthermore, it is preferable in the configuration of the circuit component built-in module of the present invention that the inorganic filler includes at least one selected from the group consisting of $Al_2O_3$, MgO, BN, AlN, and $SiO_2$. According to such a preferable configuration, an insulating substrate excellent in the heat release property can be obtained. When MgO is used for the inorganic filler, it is possible to increase the constant of linear thermal expansion. Furthermore, when $SiO_2$ (in particular, amorphous $SiO_2$) is used for the inorganic filler, it is possible to reduce the dielectric constant of the insulating substrate. Furthermore, when BN is used for the inorganic filler, it is possible to reduce the constant of linear thermal expansion.

Furthermore, it is preferable in the configuration of the circuit component built-in module of the present invention that the thermosetting resin includes at least one resin selected from the group consisting of an epoxy resin, a phenol resin, a cyanate resin and a polyphenylene ether resin because these resins are excellent in thermal resistance or insulating property.

Furthermore, it is preferable in the configuration of the circuit component built-in module of the present invention that the wiring pattern includes copper. Copper has a low thermal resistance, so that a fine wiring pattern can be formed. Furthermore, when, for example, copper is used for the wiring pattern, the surface of a copper foil that is in contact with the substrate is preferably roughened.

Furthermore, it is preferable in the configuration of the circuit component built-in module of the present invention that the wiring pattern has two layers or more including a layer formed of copper and a layer including one metal selected from the group consisting of gold, Sn, Pb, and Ni. For example, a wiring pattern formed of copper foil may be oxidized in the thermal treatment at the time of mounting after formation of patterns. However, by forming a structure having two layers or more plated by nickel, gold, or the like, oxidation can be prevented. Furthermore, it is possible to improve the connecting reliability to the circuit component.

Furthermore, it is preferable in the configuration of the circuit component built-in module of the present invention that the wiring pattern is buried in the insulating substrate. Thus, the wiring pattern is stable and the reliability can further be improved.

Furthermore, it is preferable in the configuration of the circuit component built-in module of the present invention that a region excluding an external lead electrode in the wiring pattern is covered with a protective film. In this case, it is preferable that the protective film includes a material including a resin or resist. According to such a preferable configuration, the wiring pattern is constrained by the protective film and thus the connection between the circuit component and the wiring pattern is stable and the reliability is further improved.

Furthermore, it is preferable in the configuration of the circuit component built-in module of the present invention that the circuit component includes one component selected from the group consisting of a chip resistor, a chip capacitor, and a chip inductor. By using the chip type circuit component as the circuit component, it is possible to bury the circuit component in the insulating substrate easily.

Furthermore, it is preferable in the configuration of the circuit component built-in module of the present invention that the first mixture has a thermal conductivity of 1 W/mK to 10 W/mK. According to such a preferable configuration, the thermal conductivity close to that of the ceramic substrate can be obtained and the substrate high in a heat releasing property can be obtained.

Furthermore, it is preferable in the configuration of the circuit component built-in module of the present invention that the coefficient of linear thermal expansion of the second mixture is in between the coefficient of the circuit component and the coefficient of the first mixture, because the second mixture that intervenes between the circuit component and the first mixture serves as a relaxing substance for thermal stress.

Furthermore, it is preferable in the configuration of the circuit component built-in module of the present invention that a wiring substrate is laminated on at least one principal surface to form a multilayer wiring structure. Thus, the circuit component can be mounted with higher density.

Furthermore, it is preferable in the configuration of the circuit component built-in module of the present invention that the wiring substrate is a ceramic multilayer wiring substrate. Thus, by using the high frequency property that is an excellent property of the ceramic substrate, it is possible to realize an RF module having a high performance and high function.

Alternatively, it is preferable in the configuration that the wiring substrate includes one or a plurality of circuit component built-in modules mentioned above. According to such a configuration, since the plurality of circuit component built-in modules of the present invention are laminated, it is possible to realize a highly reliable multilayer circuit component built-in module in which the circuit components are mounted with high density.

Furthermore, it is preferable in the configuration of the circuit component built-in module of the present invention that the wiring pattern connected to the circuit component is located on the principal surface on which the wiring substrate is laminated. Thus, the wiring pattern connecting to the circuit component is constrained by the wiring substrate, the connection between the circuit component and the wiring pattern is stable.

Alternatively, it is preferable that the wiring pattern connecting to the circuit component is located on the principal surface on which the wiring substrate is not laminated, and the protective film that covers the wiring pattern is provided. Thus, the wiring pattern connecting to the circuit component is constrained by the protective film, so that the connection between the circuit component and the wiring pattern is stable.

According to another aspect of the present invention, a radio device of the present invention includes the circuit component built-in module having any of the configurations mentioned above. According to such a configuration, a highly reliable radio device can be provided. In particular, it is preferable that the circuit component built-in module is an RF module using a ceramic substrate, because it is possible to realize a high performance and high function radio device.

According to another aspect of the present invention, a method for producing the circuit component built-in module of the present invention includes placing a circuit component on a first wiring pattern formed on one principal surface of a base material for connection therebetween and sealing at least a connection portion between the first wiring pattern and the circuit component with a second mixture including an inorganic filler and an uncured thermosetting resin; subsequently, allowing a first mixture including an inorganic filler and an uncured thermosetting resin to face the principal surface of the base material on which the circuit component is formed and pressing the base material to bury the circuit component in the first mixture; wherein the amount of the inorganic filler contained in the first mixture is larger than the amount of the inorganic filler contained in the second mixture.

With this method, the circuit component built-in module of the present invention can be produced.

It is preferable in the method for producing the circuit component built-in module of the present invention that the first mixture includes 70 weight % to 95 weight % of an inorganic filler and the second mixture includes 50 weight % to 90 weight % of an inorganic filler.

Furthermore, it is preferable in the method for producing the circuit component built-in module of the present invention that in sealing, by injecting an uncured second mixture into the connection portion between the first wiring pattern and the circuit component and curing the second mixture, the connection portion and the side part of the first wiring pattern and the circuit component are sealed. According to this method, since the location relationship of the first wiring pattern, circuit component and connection portion is fixed by the second mixture, in burying, it is possible to prevent the distortion of the connection portion between the circuit component and the first wiring pattern. Thus, the circuit component built-in module having a high reliability can be provided.

It is preferable in the method for producing the circuit component built-in module of the present invention that the sealing includes injecting an uncured second mixture into the connection portion between the first wiring pattern and the circuit component and curing the second mixture; molding the second mixture into a sheet of the mixture, covering the entire part of the circuit component and the first wiring pattern on the base material; and curing the second mixture sheet by heating and pressing. According to such a method, the entire part of the first wiring pattern is sealed with the second mixture, so that it is possible to prevent the first wiring pattern from being damaged when it is buried.

It is preferable in the method for producing the circuit component built-in module of the present invention that the sealing includes injecting the uncured second mixture into the connection portion between the first wiring pattern and the circuit component and the entire part of the first wiring pattern and curing thereof. According to such a method, the entire part of the first wiring pattern is sealed with the second mixture, so that it is possible to prevent the first wiring pattern from being damaged when it is buried.

It is preferable in the method for producing the circuit component built-in module of the present invention that holes are provided on the base material, and wherein the sealing includes injecting the second mixture via the hole from the opposite surface of the principal surface of the base material on which the circuit component is provided. According to such a method, it is possible to fill the second mixture easily in the gap between the circuit component and the first wiring pattern.

It is preferable in the method for producing the circuit component built-in module of the present invention that the first mixture is formed into a plate before the burying. According to such a method, by burying the circuit component in the first mixture that is molded in a form of plate, the circuit component built-in module can be produced easily.

It is preferable in the method for producing the circuit component built-in module of the present invention that the burying includes placing the first mixture into a mold, allowing the first mixture in the mold to face the principal surface on which the circuit component is formed and pressing the base material; and removing the first mixture from the mold. According to such a method, as compared with the method including a process for forming the first mixture into a form of a plate, the process can be simplified because the formation of the first mixture and the burying the circuit component are performed together.

It is preferable in the method for producing that the circuit component built-in module of the present invention further includes forming an inner via conductor in the first mixture, and forming a second wiring pattern that connects to the first wiring pattern via the inner via conductor on the surface of the first mixture opposite to the surface on which the circuit component is buried. Thus, a circuit component built-in module capable of mounting the circuit component with high density can be provided.

Furthermore, it is preferable in the method that the forming of the inner via conductor is carried out after the burying, and includes forming a through-hole for inner via conductor, which reaches the first wiring pattern from the surface of the first mixture opposite to the surface in which the circuit component is buried; and filling a thermosetting conductive substance in the through-hole for the inner via conductor. According to such a method, by forming the inner via conductor after burying, the inner via conductor without distortion can be produced.

Furthermore, it is preferable that the conductive substance includes a conductive resin composition. Thus, it is possible to product the inner via conductor by a simple process of filling the conductive resin composition in the through hole and curing thereof, thus facilitating the production of the circuit component built-in module easily.

It is preferable that the method includes, before forming the through-hole for the inner via conductor, recognizing the position of the first wiring pattern by X-ray irradiation to determine the position for forming the through-hole for the inner via conductor. According to such a method, since the position of the inner via conductor can be determined with high accuracy, it is possible to provide a circuit component built-in module having a high connection reliability.

It is preferable that the method further includes forming a through-hole for thermal via conductor in the first mixture, before burying, in forming the inner via conductor, a conductive substance is filled in the through-hole for the inner via conductor and at the same time, a thermal conductive substance is filled in the through-hole for the thermal via conductor. According to such a method, it is possible to provide a circuit component built-in module having a high thermal releasing property in the vicinity of the circuit component. Furthermore, the filling of the thermal conductive substance into the through-hole for thermal via conductor and the filling of the conductive substance into the through-hole for inner via conductor are performed at the same time, and thus the process is simplified.

It is preferable in the method that the thermal conductive substance to be filled in the through-hole for a thermal via conductor and the conductive substance to be filled in the through-hole for the inner via conductor include a metal particle and a thermosetting resin, and the content of the metal particles of the thermal conductive substance to be filled in the through-hole for the thermal via conductor is higher than the content of the metal particles of the conductive substance to be filled in the through-hole for the inner via conductor. Furthermore, it is preferable that the diameter of the through-hole for the thermal via conductor is larger than the diameter of the through-hole for the inner via conductor.

It is preferable in the method that a mold release carrier is used for the base material. Thus, the circuit component built-in module can be provided easily.

In this case, it is further preferable that the mold release carrier is an organic film. If the organic film is used as the mold release carrier, since the organic film is an insulating material, it is possible to perform a connection continuity check of the circuit components mounted on the wiring pattern formed on the mold release film.

Alternatively, it is preferable that the mold release carrier is a metal foil. In this case, as compared with the case where the resin film is used for the mold release film, the mold release carrier is not stretched, the wiring pattern can be transferred without distortion in the burying process. Furthermore, since the metal foil does not have the adhesive property unlike the organic film, when the second mixture is injected between the circuit component and the first wiring pattern, the fluid property of the second mixture is not impaired, and thus, the connection portion between the circuit component and the first wiring pattern is securely sealed with the second mixture without a gap.

Furthermore, it is preferable that the method further includes forming a peel layer on the metal foil before forming the first wiring pattern on the metal foil. Thus, the mold release carrier easily can be removed.

It is preferable in the method that the inner via conductor is formed before burying, and the mold release carrier is provided with one or a plurality of holes that serve as an ejecting hole for the first mixture in burying. According to such a method, in the process of burying, when the circuit component is buried in a state in which the mold release carrier is in contact with the first mixture, the portion of the first mixture in which the circuit component is buried is ejected from the holes of the mold release carrier. Thus, even if the inner via conductor is formed before burying, the distortion of the inner via conductor can be reduced radically. Thus, it is possible to provide a highly reliable circuit component built-in module.

Furthermore, it is preferable in the method that the multilayer wiring substrate is used for the base material. According to such a method, the circuit component is connected to the wiring formed on the principal surface of the multilayer substrate and the circuit component is buried in a state in which this multilayer substrate is in contact with the first mixture, so that the circuit component built-in module in which multilayer substrate is laminated can be provided.

In this case it is further preferable that the multilayer wiring substrate is a ceramic multilayer wiring substrate. Thus, it is possible to use the property of the high frequency of the ceramic substrate, and it is possible to realize the circuit component built-in module with the high performance and multifunction RF module.

Furthermore, it is preferable in the method that forming the second wiring pattern is performed after forming the inner via conductor, and includes laminating a metal foil on the surface of the first mixture opposite to the surface on which the circuit component is buried, heating at the temperature where the thermosetting resin of the first and second mixtures and the conductive substance of the inner via conductor are cured; and forming the metal foil into the second wiring pattern. Thus, the second wiring pattern of a desired pattern easily can be formed.

Alternatively, it is preferable in the method that forming the second wiring pattern is performed after forming the inner via conductor, and includes forming the second wiring pattern on one principal surface of the mold release carrier for the second wiring pattern, allowing the mold release carrier to face the principal surface on which the second wiring pattern is formed to the surface opposite to the surface on which the circuit component is formed and pressing the releasing carrier; heating at the temperature where the thermosetting resin of the first and second mixtures and the conductive substance of the inner via conductor are cured; and peeling off the mold release carrier.

According to such a method, the second wiring pattern is formed by the method for transferring the wiring pattern formed on the mold release carrier, so that the second wiring pattern can be buried in the first mixture. Thus, the second wiring pattern is stable and the circuit component built in module having a high reliability can be provided.

It is preferable that the method further includes forming a protective film on the region excluding the external lead electrode on the first wiring pattern. Thus, in particular, the connection between the circuit component and the first wiring pattern is stable, thus improving the reliability.

It is preferable in the method that the first wiring pattern is formed of copper foil. Furthermore, it is preferable that the second wiring pattern is also formed of copper foil. In this case, it is preferable that the method further includes forming at least one layer of a metal selected from the group consisting of Au, Sn, Pb, and Ni by electrolytic plating on the wiring pattern formed of a copper foil. Thus, the circuit component and the wiring pattern can be connected strongly.

It is preferable in the method that after forming the inner via conductor on a plate obtained by sealing and burying, the base material is peeled off to produce circuit component built-in substrate; laminating a plurality of the circuit component built-in substrates to produce a multilayer circuit component built-in substrate, and forming a second wiring pattern on the principal surface of the multilayer circuit component built-in substrate on which the first wiring pattern is not formed. According to such a method, it is possible to provide a multilayer circuit component built-in module including a plurality of circuit component built-in modules of the present invention.

BRIEF DESCRIPTION OF THE DRAWINGS

FIGS. 5A to 5J are cross-sectional views showing a process for producing a circuit component built-in module according to a fifth embodiment of the present invention.

FIGS. 8A to 8L are cross-sectional views showing a process for producing a circuit component built-in module according to an eighth embodiment of the present invention.

DETAILED DESCRIPTION OF THE INVENTION

Hereinafter, the present invention will be described more specifically with reference to embodiments.

First Embodiment

Figure 1A:
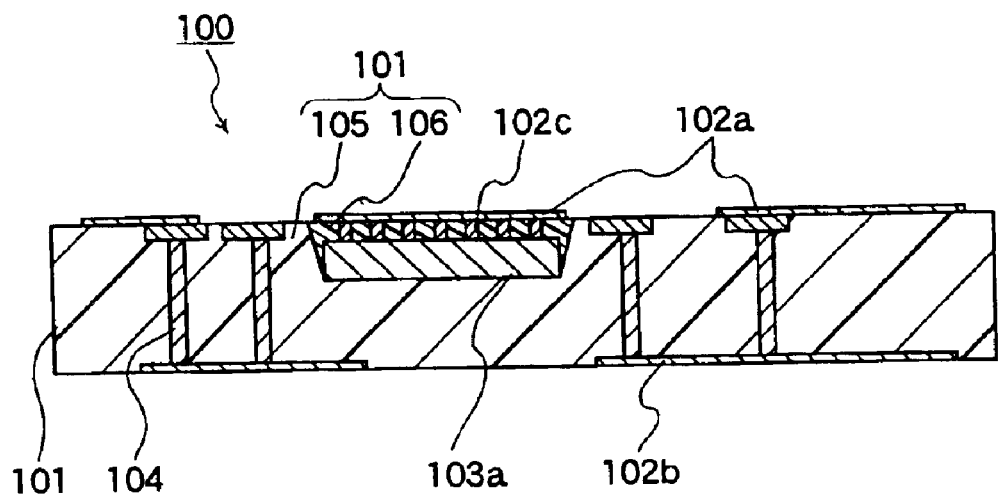
FIGS. 1A and 1B are cross-sectional views showing a configuration of a circuit component built-in module according to a first embodiment of the present invention.
Figure 1B:
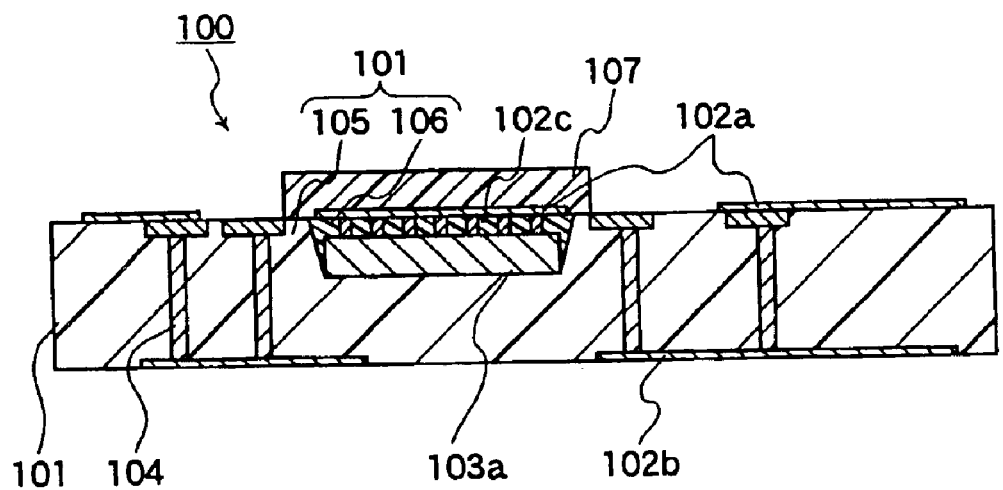

One example of a circuit component built-in module of the present invention is described in this embodiment. FIGS. 1A and 1B are cross-sectional views showing a circuit component built-in module according to the first embodiment.

As shown in FIG. 1A, the circuit component built-in module 100 of this embodiment includes an insulating substrate 101 including a first mixture 105 and a second mixture 106, wiring patterns 102a and 102b formed on one principal surface and another principal surface of the insulating substrate 101, a circuit component 103a connected to the wiring pattern 102a and placed inside the insulating substrate 101 in a state in which it is sealed with the second mixture 106, and an inner via conductor 104 for electrically connecting the wiring patterns 102a and 102b.

Each of the first mixture 105 and the second mixture 106, which forms the electric insulating substrate 101, includes an inorganic filler and a thermosetting resin. An example of the inorganic filler includes, for example, $Al_2O_3$, MgO, BN, AlN, $SiO_2$, or the like. In the first mixture 105, it is desirable that the inorganic filler is contained at as high a density as 70 weight % to 95 weight %. For example, when $SiO_2$ as the inorganic filler is contained at as high a density as 80 weight % or more in order to obtain a substrate having a low dielectric constant, it is possible to realize at least 1W/mK of thermal conductivity. Furthermore, when AlN as an inorganic filler is contained in the range of 95 weight % or more in order to obtain a substrate having a high thermal conductivity, it is possible to realize 10 W/mK of thermal conductivity. However, since the upper limit of the containing rate of the inorganic filler is 95 weight %, the upper limit of the thermal conductivity of the first mixture 105 is 10 W/mK. On the other hand, in the second mixture 106, it is desirable that the inorganic filler is contained in the range from 50 weight % to 90 weight %. Furthermore, it is desirable that the second mixture 106, which is in uncured state, has a low viscosity so that it can be injected as a sealing resin, because the gap between the circuit component 103a and the first mixture 105 is so narrow as about 50 $\mu$m and a highly viscous mixture cannot be injected perfectly therein.

For example, when the amount of an inorganic filler is reduced in order to lower the viscosity, the coefficient of thermal expansion is increased. Thus, when the circuit component 103a is a semiconductor chip, a large thermal stress is generated. Therefore, it is desirable that the amount of the inorganic filler in the second mixture 106 is 50 weight % or more.

On the other hand, 90 weight % or more of an inorganic filler increases the viscosity. As a result, a long time is required for an injection, and air pockets remain. Therefore, it is desirable that the amount of the inorganic filler in the second mixture 106 is 90 weight % or less.

Moreover, in order to make it easy to inject the second mixture 106 into a gap between the circuit component 103a and the first mixture 105, it is preferable that the difference between the amount of the inorganic filler in the first mixture 105 and the amount of the inorganic filler in the second mixture 106 is at least about 10 weight %. Therefore, it is further preferable that the amount of the inorganic filler in the first mixture 105 is about 90 to 95 weight % and the amount of the inorganic filler in the second mixture 106 is about 75 to 80 weight %.

The average particle diameter of the inorganic filler is desirably 0.1 $\mu$m to 100 $\mu$m. A desirable example of the thermosetting resin includes an epoxy resin, a phenol resin, a cyanate resin, or a polyphenylene ether resin, which are highly resistant against heat. An epoxy resin is particularly desirable because of its high heat resistance. The mixture further may include a dispersant, a coloring agent, a coupling agent or a releasing agent.

In the below-mentioned embodiments, as the first and second mixtures, a mixture that satisfies the above-mentioned conditions is used.

The wiring patterns 102a and 102b include a substance having an electric conductivity, for example, a copper foil or a conductive resin composition. As a copper foil used for the wiring pattern, it is possible to use, for example, a copper foil having a thickness of about 12 $\mu$m to 35 $\mu$m, which is formed by electrolytic plating. It is desirable that the side of the copper foil surface that is in contact with the insulating substrate 101 is made rough so that the adhesion with the insulating substrate 101 can be improved. Furthermore, the copper foil whose surface has been subjected to a coupling treatment or plated with tin, zinc or nickel may be used in order to improve the adhesion property and oxidation resistance. Furthermore, the copper foil whose surface has been subjected to solder plating with Sn—Pb alloy or solder plating with Pb-free alloy, such as Sn—Ag—Bi, alloy may be used. Furthermore, the wiring patterns 102a and 102n can be buried in the insulating substrate 101 when they are formed by a transfer method as described in the below mentioned second embodiment. A metal lead frame produced by etching or punching may be used for the wiring patterns 102a and 102b.

The circuit component 103a may be an active component or a passive component. For the active component, a semiconductor device such as a transistor, an IC, an LSI, or the like, can be used. This semiconductor device may be a bare semiconductor chip, for example, a bare SAW chip, etc. The same is true in the following embodiments. For the passive component, an inductor, a capacitor, a resistor, or the like can be used.

The wiring pattern 102a is connected to the circuit component 103a by, for example, a flip chip bonding.

The inner via conductor 104 is formed of, for example, a thermosetting conductive substance. For example, a conductive resin composition mixing metal particles with a thermosetting resin can be used. An example of the metal particles includes gold, silver, copper, nickel, or the like.

Gold, silver, copper and nickel are desirable because of their high conductivity. Among them, copper is the most disirable because of its especially high conductivity and small migration. An example of the thermosetting resin includes an epoxy resin, a phenol resin or a cyanate resin, a polyphenylene ether resin, or the like. An epoxy resin is particularly desirable because of its high heat resistance.

In the circuit component built-in module 100 of this embodiment, the wiring patterns 102a and 102b are connected by the inner via conductor 104 formed in the insulating substrate 101. Therefore, in the circuit component built-in module 100, the circuit components 103 can be mounted with high density. On the other hand, in order to make the module thin by building in the circuit component, it is needless to say that the configuration in which no inner via conductor is provided and the thickness of the substrate is substantially the same as that of the circuit component can be realized.

Furthermore, in the circuit component built-in module 100, the inorganic filler contained in the insulating substrate 101 swiftly conducts the heat generated in the circuit components. Therefore, a highly reliable circuit component built-in module can be obtained.

Furthermore, in the circuit component built-in module 100, the coefficient of linear expansion, the thermal conductivity and the dielectric constant of the insulating substrate 101 can be controlled easily by selecting a suitable inorganic filler for the insulating substrate 101. The coefficient of linear expansion of the insulating substrate 101 substantially equal to that of the semiconductor device can prevent the occurrence of cracks and the like, due to a temperature change. Consequently, a reliable circuit component built-in module can be obtained. Furthermore, an improvement in the thermal conductivity of the insulating substrate 101 allows a highly reliable circuit component built-in module to be produced even if the circuit components are mounted with high density. Furthermore, a low dielectric constant of the insulating substrate 101 allows a module for a high frequency circuit with little dielectric loss to be produced.

Furthermore, in the circuit component built-in module 100, the insulating substrate 101 can shield the circuit components 103a from the external air, thus preventing deterioration of the reliability due to humidity.

Furthermore, in the circuit component built-in module 100, the insulating substrate 101 is formed of a mixture of an inorganic filler and a thermosetting resin, so that the insulating substrate 101 can be produced easily without being sintered at a high temperature like a ceramic substrate.

In the circuit component built-in module 100 shown in FIG. 1A, the wiring pattern 102a is not buried in the insulating substrate 101. However, the wiring pattern 102a may be buried in the insulating substrate 101.

In the circuit component built-in module 100 shown in FIG. 1A, no circuit component is mounded on the wiring pattern 102a. However, a circuit component may be mounded on the wiring pattern 102a, and the circuit component built-in module may be molded with resin. The circuit components can be mounted with a higher density by mounting circuit components on the wiring pattern 102a.

As shown in FIG. 1B, it is further preferable that a protective film 107 formed of a resist or a sealing resin is formed in the region excluding an external lead wiring in the wiring pattern 102a. With a configuration, the wiring pattern 102a is located and constrained inside the protective film 107. Consequently, the connection between the circuit component 103a and wiring pattern 102a is more stable.

Furthermore, in general, the bare chip has a problem in terms of KGD (known good die), handling is difficult, and cost is high. However, it is advantageous to build the bare chip in the insulating substrate as in this embodiment because the quality check becomes easy. Furthermore, re-wiring becomes easy, so that it is possible to attain various LGA electrodes having less restriction in designing.

Second Embodiment

Methods for producing the circuit component built-in module described in the first embodiment will be described with reference to the second embodiment. The materials and the circuit components used in this embodiment are the same as those described in the first embodiment.

FIGS. 2A to 2I are cross-sectional views showing a process for producing a circuit component built-in module according to a second embodiment.

Figure 2A:
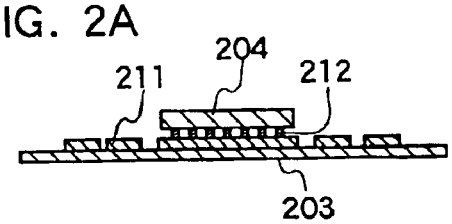
FIGS. 2A to 2I are cross-sectional views showing one process for producing a circuit component built-in module according to a second embodiment of the present invention.

First, as shown in FIG. 2A, a copper foil wiring pattern 211 is formed on a mold release film 203, and a circuit component, for example, a semiconductor chip 204, is flip-chip bonded thereon. As the mold release film 203, an organic film having a predetermined adhesive strength, for example, polyethylene terephthalate, polyphenylene sulfide, etc. may be used. It is advantageous to use an organic film for the mold release film because the organic film is an insulating material, and it is possible to perform a connection continuity check of the circuit components mounted on the wiring pattern which is formed on the mold release film.

For the mold release film, a metal foil with a peel layer made of a suitable organic film may be used. An example of the metal foil includes a copper foil, an aluminum foil, and the like. Furthermore, a copper foil wiring pattern 211 may be formed on a mold release film 203 via a metal plating layer, for example, a Ni plating layer. The copper foil wiring pattern 211 can be formed, for example, through a photolithography process or an etching process, after the copper foil is adhered to the mold release film 203. Furthermore, instead of the copper foil wiring pattern 211, a lead frame produced by etching or punching may be used (the same is true in embodiments hereinafter).

A semiconductor chip 204 is electrically connected to the copper foil wiring pattern 211 via a conductive adhesive 212. As the conductive adhesive 212, it is possible to use, for example, a mixture obtained by mixing and kneading a thermosetting resin with gold, silver, copper, a silver-palladium alloy, or the like.

Instead of the conductive adhesive 212, a gold bump produced by a gold wire bonding or a solder bump may be formed on the side of the semiconductor chip 204 beforehand. In this case, the gold or solder may be dissolved by a heat treatment, so that the semiconductor chip 204 is mounted on the copper foil wiring pattern 211. Furthermore, the solder bump also can be used together with the conductive adhesive.

Figure 2C:
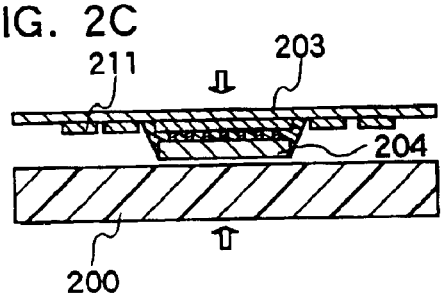
Figure 2B:

Then, as shown in FIG. 2B, a second mixture 210 is injected between the copper foil wiring pattern 211 and the semiconductor chip 204 to seal therebetween. By injecting the mixture for sealing, stress generated due to the difference in the coefficient of thermal expansion between the semiconductor chip 204 and a plate in which the semiconductor chip 204 is buried (a first mixture 200, which will be described hereinafter) can be absorbed not only by a connection portion (a conductive adhesive 212) but also by an entire second mixture 210 for sealing, thus preventing the concentration of stress. Furthermore, the injection of a sealing resin prevents the formation of gaps between the semiconductor chip 204 and the wiring pattern 211 in a subsequent process of burying the semiconductor chip 204 in the copper foil wiring pattern 211. An underfill resin, which is used for general flip chip bonding, can be used for the sealing mixture.

In parallel to the processes shown in FIGS. 2A and 2B, a first mixture 200 is formed by processing a mixture including an inorganic filler and a thermosetting resin in a form of a plate, as shown in FIG. 2C. The first mixture plate 200 is formed by mixing and kneading an inorganic filler and an uncured thermosetting resin to form a paste-state kneaded mixture and forming the paste-state kneaded mixture into a predetermined thickness.

The first mixture plate 200 may be heated at a temperature below the curing temperature of the thermosetting resin. The heat treatment allows the adhesion of the first mixture 200 to be eliminated while maintaining the flexibility, thereby facilitating the subsequent processes. In addition, in the case of a mixture including a thermosetting resin dissolved in a solvent, a heat treatment can remove a part of the solvent.

Thereafter, as shown in FIG. 2C, the mold release film 203 having the copper foil wiring pattern 211 on which the semiconductor chip 204 is mounted is superimposed on the first mixture 200 in a suitable position.

Figure 2E:
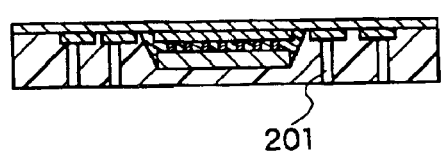
Figure 2D:

Next, as shown in FIG. 2D, a plate, in which the semiconductor chip 204 is buried in the first mixture 200, is formed by pressing the product in which the mold release film 203 is superimposed on the first mixture 200 in a suitable position from the outside of the first mixture 200 and the mold release film 203.

Next, as shown in FIG. 2E, through-holes 201 are formed in the mixture plate in which the semiconductor chip 204 is buried in the first mixture 200. The through-holes 201 pass from the rear side of the surface on which the semiconductor 204 is buried and reaches the copper foil wiring pattern 211. At this time, it is preferable that the position of the copper foil wiring pattern 211 can be recognized by using an X-ray, etc. from the rear side of the surface on which the semiconductor chip 204 is buried. The through-holes 201 are formed by, for example, laser processing. Laser processing is desirable because it allows formation of the through-holes 201 in a fine pitch and generates no debris. In laser processing, a carbon dioxide gas laser or excimer laser is used to facilitate the processing.

Figure 2F:
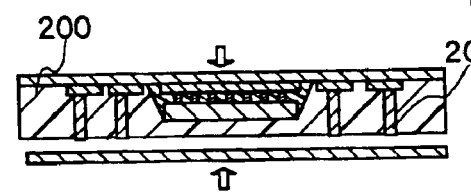

Next, as shown in FIG. 2F, a conductive resin composition 202 is filled in the through-holes 201 in the mixture plate.

Figure 2G:
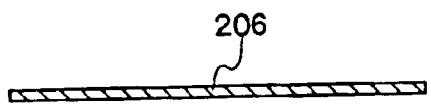

In parallel to the processes shown in FIGS. 2A to 2F, as shown in FIG. 2G, a copper foil 206 is formed.

Thereafter, as shown in FIG. 2F, the copper foil 206 is superimposed on the opposite surface to the semiconductor chip 204 in the plate.

Figure 2H:
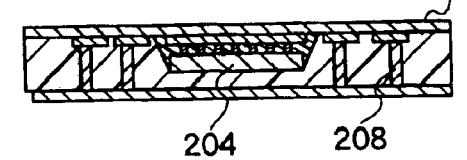

Then, as shown in FIGS. 2F and 2H, the plate on which the copper foil 206 is superimposed is subjected to heat treatment with pressure. Thereby, the thermosetting resin in the first mixture 200 and the conductive resin composition 202 is cured. Thus, the plate is formed in which the circuit component 204 is buried in the first mixture 200 and the copper foil 206 is adhered to the opposite surface to the semiconductor chip 204.

The heating is performed at a temperature equal to or higher than a temperature at which the thermosetting resin in the first mixture 200, the second mixture 210 and the conductive resin composition 202 is cured (e.g., 150° C. to 260° C.). The first mixture 200 serves as an insulating substrate 207, and the conductive resin composition 202 serves as an inner via conductor 208. This process strongly adheres the copper foils wiring pattern 211 and the copper foil 206 to the insulating substrate 207 mechanically. The mechanical strength of the circuit component module can be improved by applying a pressure of 10 kg/cm$^2$ to 200 kg/cm$^2$ while heating to cure the thermosetting resin in the first mixture 200, the second mixture 210 and the conductive resin composition 202 (the same is true in the following embodiments).

Figure 2I:
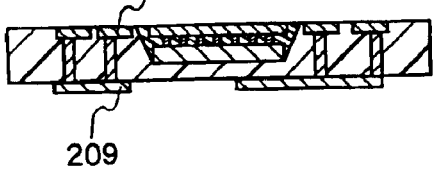

Then, as shown in FIG. 2I, the mold release film 203 is peeled off so as to process the copper foil 206 into a wiring pattern. Thus, a circuit component built-in module having the wiring patterns 211 and 209 is completed.

As mentioned above, the circuit component built-in module having the same configuration as in the first embodiment can be obtained. According to the producing method mentioned above, it is possible to produce the circuit component built-in module having the same configuration as in first embodiment with the position accuracy of the inner via conductor maintained highly.

In addition, by printing a resist with respect to the configuration shown in FIG. 2I, a protective film (107) for constraining wiring patterns connecting directly to the circuit component may be formed as shown in FIG. 1B. Furthermore, this protective film also can be formed by injecting an underfill resin or laminating an uncured resin sheet, besides the resist printing method.

Furthermore, in this embodiment, the thermosetting conductive resin composition 202 is used for the conductive material for filling the through-hole 201. However, the conductive substance is not limited thereto, and any thermosetting conductive substance can be used (which also applies to the following embodiments). Furthermore, prior to burying the semiconductor chip 204, the through-hole 201 may be formed in the first mixture plate 200 into which conductive resin composition 202 is filled, thus forming an inner via conductor. However, when the circuit component built-in module is formed in this order, it is necessary to bury the semiconductor chip 204 so that the position and shape of the through-hole 201 are not distorted.

Therefore, it is preferable to use the following producing method.

Figure 11A:
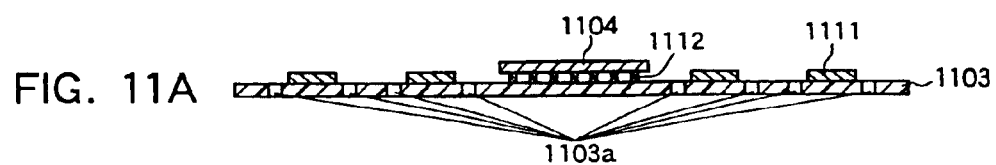
FIGS. 11A to 11F are cross-sectional views showing another process for producing a circuit component built-in module according to the second embodiment of the present invention.
Figure 11B:
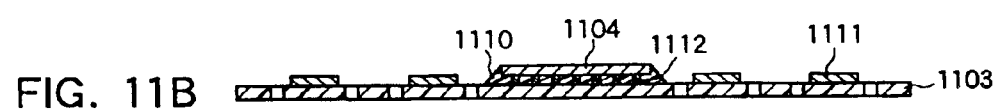

First, as shown in FIGS. 11A and 11B, a copper foil wiring pattern 1111 is formed on the mold release film 1103 and then, a circuit component, for example, a semiconductor chip 1104 is flip-chip bonded. Furthermore, a plurality of holes 1103a are provided on the portion of the mold release film 1103 in which the circuit pattern 1111 and the semiconductor chip 1103 are not placed. For the mold release film 1103, an organic film having a predetermined adhesive strength, for example, polyethylene terephthalate or polyphenylene sulfide, may be used. Or a metallic film with a peel layer made of a suitable organic film may be used. An example of the metal foil includes a copper foil, an aluminum foil, and the like. Furthermore, between the mold release film 1103 and the copper foil 1111, a metal plating layer, for example, a Ni plating layer, may be intervened.

Figure 11C:
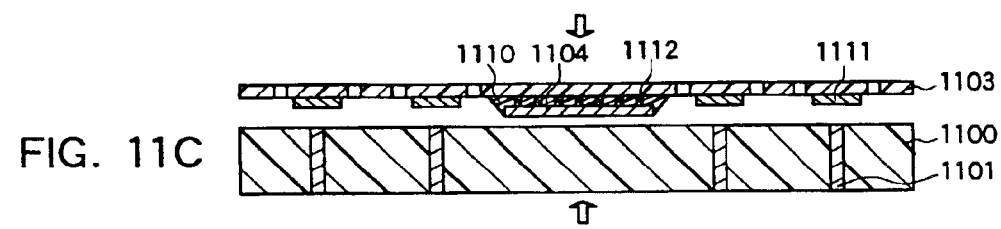

Herein, as shown in FIG. 11C, a plate having a inner via conductor 1101 is formed beforehand by forming a through-hole on the first mixture plate 1100 and then by filling a conductive paste therein. Then, with respect to this plate, the inner via conductor 1101 and the wiring pattern 1111 are brought into contact with the mold release film 1103 in a suitable position.

Figure 11D:
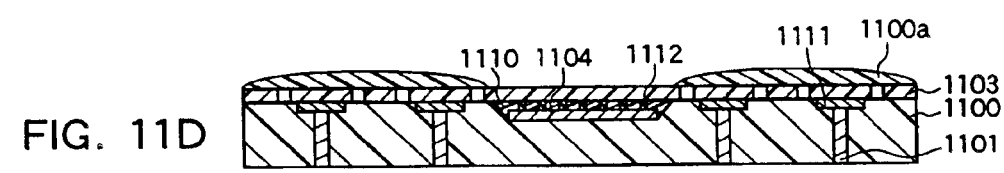

At this time, as shown in FIG. 11D, the first mixture 1100 on the part in which a semiconductor chip 1104 is buried is pushed toward the peripheral portion, thereby excess resin composition 1100a is ejected from the holes 1103a of the mold release carrier 1103. Thereby, it is possible radically to reduce the distortion of the inner via conductor 1101 in the vicinity of the chip when the semiconductor chip 1104 is buried.

Figure 11E:
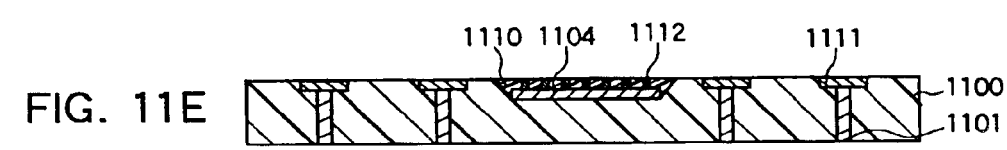
Figure 11F:
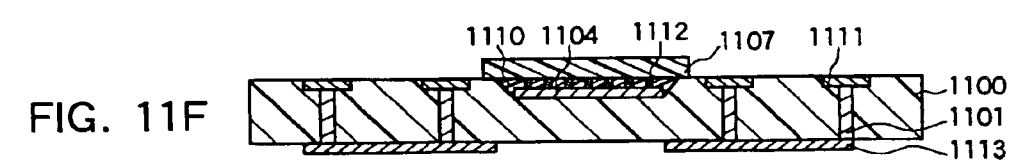

Furthermore, as shown in FIG. 11E, the mold release carrier 1103 is peeled off, as shown in FIG. 11F, a protective film 1107 and a wiring pattern 1113 are formed if necessary. Thus, a circuit component built-in module having the same configuration as in the first embodiment can be produced.

Furthermore, in this embodiment, the configuration in which a wiring pattern 209 and wiring pattern 1113 are not buried in a substrate is described. However, these wiring patterns may be buried in the first mixture 1100 by a transfer method.

Third Embodiment

Another embodiment of the method for producing the circuit component built-in module shown in the first embodiment will be described. The materials and the circuit components used in this embodiment are the same as those described in the first embodiment.

FIGS. 3A to 3I are cross-sectional views showing a process for producing a circuit component built-in module according to a third embodiment.

Figure 3A:
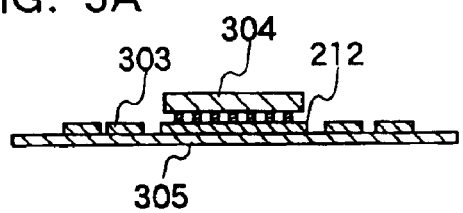
FIGS. 3A to 3I are cross-sectional views showing a process for producing a circuit component built-in module according to a third embodiment of the present invention.

First, as shown in FIG. 3A, a wiring pattern 303 is formed on a mold release film 305, and a circuit component, for example, a semiconductor chip 304, is mounted on the wiring pattern 303. Since the method for mounting the semiconductor chip 304 is the same as in the second embodiment (see FIGS. 2A and 2B), the same explanation is not repeated herein.

Figure 3C:
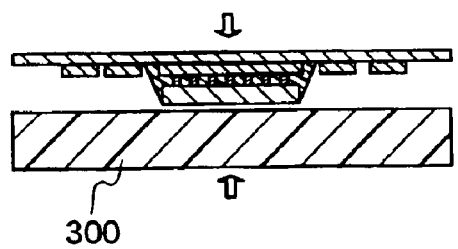
Figure 3B:

Then, as shown in FIG. 3C, by processing a mixture including an inorganic filler and a thermosetting resin in a form of a plate, a first mixture plate 300 is formed. Then, the wiring patterns 303 on which the semiconductor chip 304 is mounted and a mold release film 305 are superimposed on the first mixture 300 in a suitable position. Then, a product, which is obtained by superimposing the wiring pattern 303 on which the semiconductor chip 304 is mounted and the mold release film 305 on the first mixture 300 in a suitable position, is pressed from the outside of the first mixture 300 and the mold release film 305 so as to bury the semiconductor chip 304 on which the mold release film 305 is mounted in the first mixture 300, as shown in FIGS. 3C and 3D. Since the above-mentioned process is the same as in the second embodiment (see FIGS. 2C and 2D), the same explanation is not repeated herein.

Figure 3E:
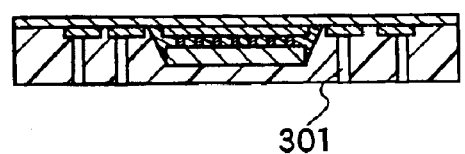
Figure 3D:
Figure 3F:
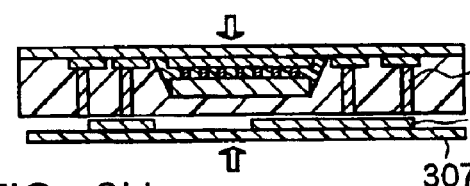

Then, as shown in FIGS. 3E and 3F, the position of the wiring patterns 303, which are formed on the principal surface corresponding to the through-holes 301, are recognized by a method using an X-ray, etc. in a state in which the semiconductor chip 304 is buried in the first mixture 300. Thus, the through-holes 301 are formed in the first mixture 300, and the conductive resin composition 302 is filled in the through-holes 301. Since the above-mentioned processes are the same as in the second embodiment (see FIGS. 2E and 2F), the same explanation is not repeated herein.

Figure 3G:
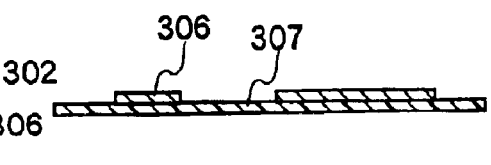

In parallel to the processes of FIGS. 3A to 3E, as shown in FIG. 3G, a wiring pattern 306 is formed on the mold release film 307.

Thereafter, as shown in FIG. 3F, the mold release film 307 is superimposed in a suitable position on the surface of the first mixture 300 on the opposite side to the semiconductor chip 304 so that the wiring pattern 306 is connected to the conductive resin composition 302 at the predetermined portion.

Figure 3H:
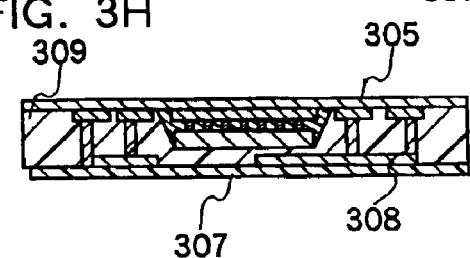

Thereafter, as shown in FIGS. 3F and 3H, the first mixture 300 on which the mold release film 307 is superimposed in a suitable position on the opposite side to the semiconductor chip 304 is pressed from the outside of the mold release film 307 and heated to cure the thermosetting resin in the first mixture 300, second mixture 310 and the conductive resin composition 302, and thus a plate in which a semiconductor chip 304 and the wiring patterns 303 and 306 are buried is formed.

The heating is performed at a temperature equal to or higher than a temperature at which the thermosetting resin in the first mixture 300, the second mixture 310 and the conductive resin composition 302 is cured (e.g., 150° C. to 260° C.). The first and second mixtures 300 and 310 serve as an insulating substrate 309, and the conductive resin composition 302 serves as an inner via conductor 308. The inner via conductor 308 allows the wiring pattern 303 and the wiring pattern 306 to connect electrically.

Figure 3I:
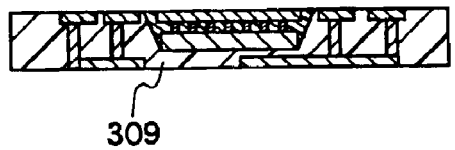

Thereafter, as shown in FIG. 3I, the mold release films 305 and 307 are peeled off from the insulating substrate 309.

Thus, the circuit component built-in module as described in the first embodiment can be obtained. The above-mentioned method facilitates the production of the circuit component built-in module as described in the first embodiment.

In this embodiment, the mold release films 305 and 307 on which the wiring pattern 303 and 306 have been formed beforehand are used, so that the obtained circuit component built-in module has a smooth surface as a result of burying the wiring patterns 303 and 306 in the insulating substrate 309. The smoothness of the surface makes it possible to mount the components on the wiring pattern 306 with high density, thus attaining higher density circuit components.

Fourth Embodiment

Figure 4A:
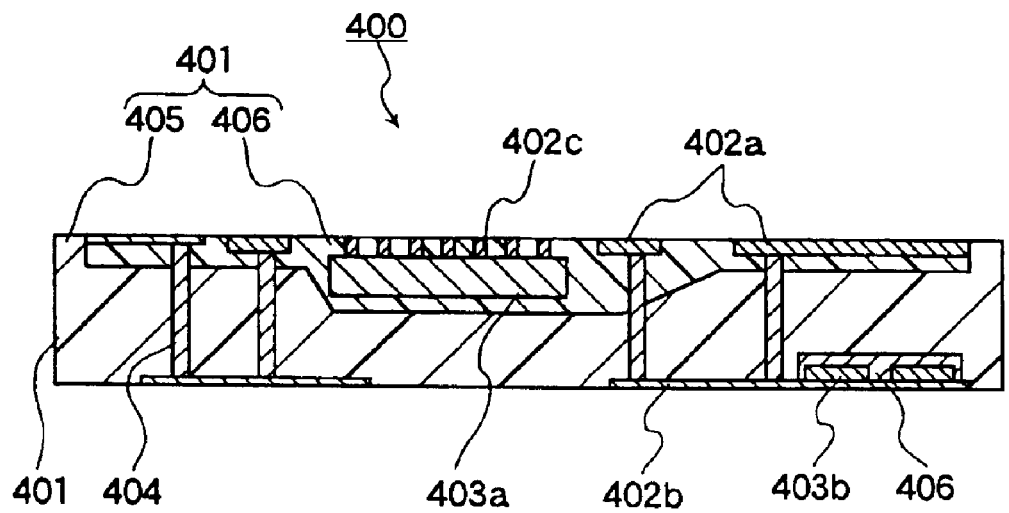
FIGS. 4A and 4B are cross-sectional views showing a configuration of a circuit component built-in module according to a fourth embodiment of the present invention.

A circuit, component built-in module having a configuration in which an entire wiring pattern on the principal surface is covered with the second mixture will be described with reference the fourth embodiment. FIG. 4A is a cross-sectional view showing a circuit component built-in module of this embodiment.

As shown in FIG. 4A, the circuit component built-in module 400 of this embodiment includes an insulating substrate 401 formed of a first mixture 405 including 70 weight % to 95 weight % of an inorganic filler and a thermosetting resin and the second mixture 406 including 50 weight % to 90 weight % of an inorganic filler and a thermosetting resin, wiring patterns 402a and 402b formed on one principal surface and another principal surface of the insulating substrate 401, a circuit component 403 (active component 403a) connected to the wiring pattern 402a and placed in an internal portion of the second mixture 406, a circuit component 403 (passive component 403b) connected to the wiring pattern 402b and placed in an internal portion of the second mixture 406, and inner via conductors 404 electrically connecting the wiring patterns 402a and 402b.

The main difference between the first embodiment and this embodiment is in that the second mixture 406 functioning as a sealing resin or a sealing sheet of the wiring portion to the circuit component covers not only the connecting portion 402c between the active component 403a and the wiring pattern 402a but also the entire wiring pattern 402a. In general, if an organic film is used as a mold release film, it stretches when buried into the circuit component, and the wiring pattern is distorted. On the other hand, it is possible to prevent disconnection and distortion of the wiring pattern 402a, which occurs when the circuit component 403 is buried due to the flaw of the uncured sheet including the first mixture 405 by covering the wiring pattern 402a connected to the active component 403a prior to burying. Furthermore, the second mixture has a smaller amount of an inorganic filler and a larger amount of resin composition with respect to the first mixture. Thus, the adhesive strength of the wiring pattern is larger and the reliability of the wiring pattern is improved. Hereinafter, each configuration will be described.

The mixtures 405, 406 forming the insulating substrate 401 include an inorganic filler and a thermosetting resin. An example of the inorganic filler includes $Al_2O_3$, MgO, BN, AlN, and $SiO_2$. It is desirable in the first mixture 405 that the inorganic filler is contained with high density, i.e., 70 weight % to 95 weight %. On the other hand, it is desirable in the second mixture 406 that the inorganic filler is contained at 50 weight % to 90 weight % of the inorganic filler. And it is desirable that the second mixture in a state in which it is uncured has low viscosity so that it can be injected into the connecting portion as a sealing resin between the positive component 403a and the wiring pattern 402a. Therefore, the containing rate of the inorganic filler is smaller than that of the first mixture 405. However, as the second mixture 406 covering the positive component 403a and the wiring pattern 402a, an uncured sheet having a low viscosity may be used. The weight of the inorganic filler forming the uncured sheet is not limited to the range of 50 weight % to 90 weight %, and up to 95 weight % of an inorganic filler may be included.

The average particle diameter of the inorganic filler is desirably 0.1 $\mu$m to 100 $\mu$m. Desirable examples of the thermosetting resin include an epoxy resin, a phenol resin, a cyanate resin, or a polyphenylene ether resin. An epoxy resin is the most desirable because of its especially high heat resistance. Each mixture further may include a dispersant, a coloring agent, a coupling agent or a releasing agent.

Since the wiring patterns 402a, 402b, and 402c are the same as the wiring patterns 102a and 102b, which are described in the first embodiment, the same explanation is not repeated herein.

In this embodiment, the wiring pattern 402a is covered with the second mixture 406, and then buried in the first mixture 405. Therefore, even if a fine line having line/space of 50 $\mu$m/50 $\mu$m or more is formed, disconnection does not occur after the wiring pattern 402a is buried. Thus, the wiring pattern 402a is not damaged.

The circuit component 403 includes, for example, an active component 403a and a positive component 403b. Since the active component 403a and the positive component 403b are the same as the active component 103a and the positive component 103b, which are described in the first embodiment, the same explanation is not repeated herein.

The connection portion 402c between the wiring pattern 402a and the active component 402c uses, for example, a flip chip bonding.

Since the inner via conductor 404 is the same as the inner via conductor 104, which is described in the first embodiment, the same explanation is not repeated herein. It is needless to say that the inner via conductor is not always necessary in accordance with the configuration of the module and the application of use.

FIG. 4A describes the circuit component built-in module 400 in which the wiring pattern 402a and 402b may not be buried in the insulating substrate 401. However, the configuration is not always limited to this and the wiring patterns 402a and 402b are not buried in the insulating substrate 401.

Figure 4B:
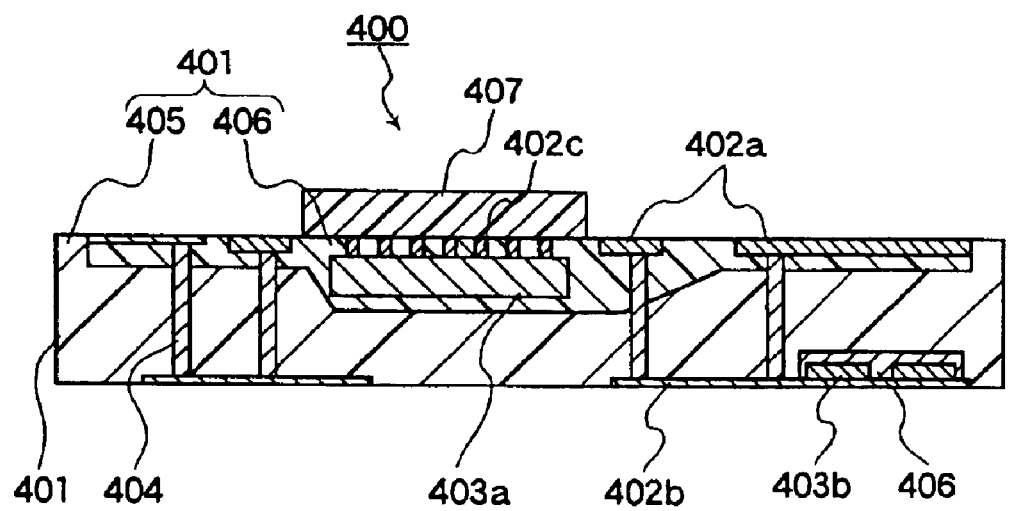

Furthermore, it is further preferable that, as shown in FIG. 4B, the protective film 407 made of a resist or a sealing resin is formed on the region excluding the external lead wiring of the wiring pattern 402a. According to this configuration, in particular, the connection portion 402c between the active component 403a and the wiring pattern 402a is constrained by the protective film 407, and thus the connection reliability is improved.

Fifth Embodiment

A method for producing a circuit component built-in module described with reference to the fourth embodiment will be described with reference to the fifth embodiment.

The materials and the circuit components used in the fifth embodiment are the same as those described in the fourth embodiment.

FIGS. 5A to 5I are cross-sectional views showing a process for producing the circuit component built-in module of this embodiment.

First, as shown in FIG. 5A, a wiring pattern 503a is formed on a mold release film 505, and an active component, for example, a semiconductor chip 504 is mounted on the wiring pattern 503a via a connection portion 503b. The method for mounting the semiconductor chip 504 is the same as in the second embodiment (see FIGS. 2A and 2B), and the explanation is not repeated herein.

Thereafter, as shown in FIG. 5B, a sealing resin including the second mixture 510 is injected into not only a connection portion 503c but also an entire portion of the wiring pattern 503a connected to the active component for sealing. Thus, the injection of the sealing resin prevents the stress concentration. This makes it possible to prevent the generation of gap between the semiconductor chip 504 and the wiring pattern 503a, a disconnection of the wiring pattern 503a and the distortion of the wiring pattern 503a, and the like.

Then, as shown in FIG. 5C, by processing the mixture including an inorganic filler and a thermosetting resin in a form of a plate, a first mixture plate 500 is formed. Thereafter, the wiring patterns 503a on which the semiconductor chip 504 is mounted and a mold release film 505 are superimposed on the first mixture plate 500 in a suitable position.

Then, as shown in FIGS. 5C and 5D, the mold release film 505 is superimposed on the first mixture 500 in a suitable position and pressed. Thereby, the semiconductor 504 mounted on the mold release film 505 is buried into the first mixture 500. Since the above-mentioned process is the same as in the second embodiment (see FIGS. 2C and 2D), the same explanation is not repeated herein. The wiring pattern 503a and the semiconductor 504 are sealed with the second mixture 510 and thus completely protected.

Then, as shown in FIGS. 5E and 5F, the positions of the wiring pattern 503a, which are formed on the principal surface corresponding to the through-holes 501, are recognized by a method using an X-ray, etc. in a state in which the semiconductor chip 504 is buried in the first mixture 500. Thus, the through-holes 501 are formed on the predetermined position in the first mixture 500, and the conductive resin composition 502 is filled in the through-hole 501. Since the above-mentioned processes are the same as in the second embodiment (see FIGS. 2E and 2F), the explanation is not repeated herein.

In parallel to the processes of FIGS. 5A to 5E, as shown in FIG. 5G, a wiring pattern 503c is formed on the mold release film 507, and the passive component, for example, a chip capacitor 506, is mounted. Thereafter, as shown in FIG. 5H, the second mixture 510 is formed so as to cover the chip capacitor 506 and the wiring pattern 503c connected to the chip capacitor 506. The method for producing the second mixture 510 is the same as in FIG. 5B.

Then, as shown in FIG. 5F, the mold release film 507 is superimposed in the suitable position on the surface of the first mixture 500 on the opposite side to the surface having the semiconductor chip 504 so that the wiring pattern 506 is connected to the conductive resin composition 502 in the predetermined portion.

Thereafter, as shown in FIGS. 5F and 5I, the product in which the mold release film 507 is superimposed in the suitable position on the surface opposite to the surface having the semiconductor chip 504 on the first mixture 500 is pressed from the outside of the mold release film 507 and heated. Thus, the thermosetting resin in the first mixture 500, the second mixture 510 and the conductive resin composition 502 is cured, so that a plate is formed in which the semiconductor chip 504, the chip capacitor 506 and the wiring patterns 503a, 503b and 503c are buried in the first mixture 500.

The heating is performed at a temperature equal to or higher than a temperature at which the thermosetting resin in the first mixture 500, the second mixture 501 and the conductive resin composition 502 is cured (e.g., 150 ° C. to 260° C). The first and second mixtures 500 and 501 serve as an insulating substrate 509, and the conductive resin composition 502 serves as an inner via conductor 511. The inner via conductor 511 allows the wiring patterns 503a and the wiring pattern 503c to connect each other electrically.

Thereafter, as shown in FIG. 5J, the mold release films 505 and 507 are peeled from the insulating substrate 509.

Thus, the circuit component built-in module as described in the fourth embodiment can be produced. According to the producing method mentioned above, the connection reliability between the built-in chip capacitor 506 and the wiring pattern 503c can be secured with the second mixture 510. Sixth Embodiment A method for producing the circuit component built-in module described with in the fourth embodiment will be described with reference to the sixth embodiment. The materials and the circuit components used in this embodiment are the same as in the fourth embodiment.

FIGS. 6A to 6I are cross-sectional views showing a process for producing the circuit component built-in module of this embodiment.

Figure 6A:
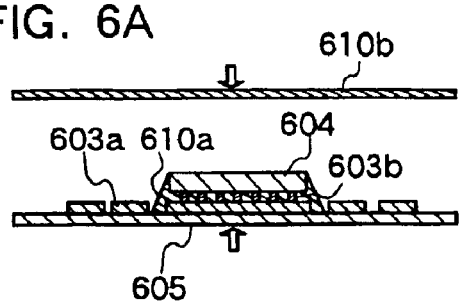
FIGS. 6A to 6J are cross-sectional views showing a process for producing a circuit component built-in module according to a sixth embodiment of the present invention.

First, as shown in FIG. 6A, a copper foil wiring pattern 603a is formed on a mold release film 605, and a circuit component, for example, a semiconductor chip 604, is mounted on the copper foil wiring pattern 603a via a connection portion 603b. The sealing is performed by injecting the second mixture 610a between the copper foil wiring pattern 603a and the semiconductor chip 604. This injection of the mixture for sealing makes it possible to release the stress concentrated on the connection portion 603b by the entire second mixture 610a. In the subsequent process in which the semiconductor device is buried in a from of the plate, it is possible to prevent the generation of a gap between the semiconductor device and the wiring pattern. For the mixture for sealing, an underfill resin, which can be used for the general flip chip bonding, can be used.

At the same time, by processing the mixture including the inorganic filler and the thermosetting resin in a form of a sheet, the second mixture 610b is formed. The second mixture sheet 610b desirably has a low melting viscosity because it covers a fine wiring pattern 603a or the semiconductor 604.

Figure 6C:
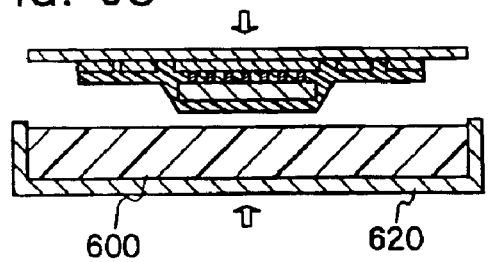
Figure 6B:
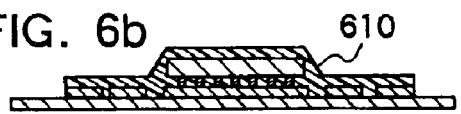

Then, as shown in FIGS. 6A and 6B, the second mixture (a mixture sheet) 610b is superimposed on the semiconductor chip 604 mounted on a mold release body 605 and is pressed and heated. Thus, the wiring pattern 603a, the semiconductor chip 604, and the connection portion 603b, which are covered with the cured second mixture 610b, can be obtained.

When the region of the wiring pattern connected to the semiconductor chip 604 is relatively large, as described in the fifth embodiment, it is difficult to cover the region with a sealing resin. However, according to the method of this embodiment, it is easy to cover the entire wiring pattern and protect it easily.

In parallel to the processes shown in FIGS. 6A and 6B, a first mixture 600 in an uncured state is formed by mixing an inorganic filler and a thermosetting resin.

Thereafter, as shown in FIG. 6C, the semiconductor chip 604 and the copper foil wiring pattern 603a, which are protected by the second mixture 610a and 610b are superimposed on the first mixture 600 placed in a mold 620, so that the first mixture 600 has a predetermined thickness.

Figure 6E:
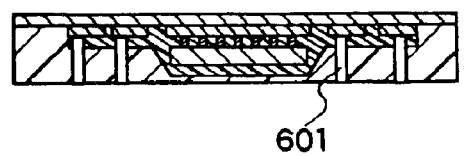
Figure 6D:

Then, as shown in FIGS. 6C and 6D, the semiconductor chip 604 and the copper foil pattern 603a, which are protected by the second mixture 610a and 610b, are superimposed on the first mixture 600, and a plate in which the semiconductor 604 and wiring patterns 603a and 603b are buried in the first mixture 600 is formed. According to this method, the process of primarily molding the first mixture 600 into the plate 500 as shown in the fifth embodiment can be omitted, thus facilitating the process.

Since the process after the semiconductor chip 604 is buried in the first mixture 600 (see FIGS. 6E to 6J) is the same as in the fifth embodiment, the same explanation is not repeated herein.

Seventh Embodiment

Figure 7:
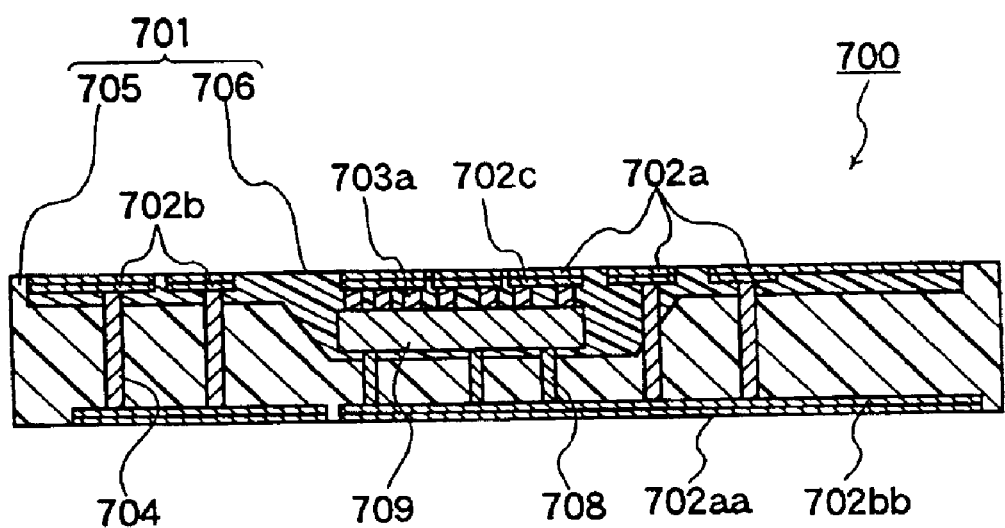
FIG. 7 is a cross-sectional view showing a configuration of a circuit component built-in module according to a seventh embodiment of the present invention.

One example of a circuit component built-in module in which a thermal via conductor is placed will be described with reference to the seventh embodiment. FIG. 7 is a cross-sectional view showing a circuit component built-in module of this embodiment.

As shown in FIG. 7, the circuit component built-in module 700 of this embodiment includes an insulating substrate 701 including a first mixture 705 and a second mixture 706; two-layered wiring patterns 702a, 702b and 702aa, 702bb, which are formed on one principal surface and another principal surface of the insulating substrate 701; a circuit component, for example, a semiconductor device 709, which is connected to the wiring patterns 702a and 702b and placed in the internal portion of the insulating substrate 701 (an internal portion of the second mixture 706); inner via conductors 704 allowing the wiring patterns 702b and 702bb to connect each other electrically; and thermal via conductors 708 physically connecting the semiconductor device 709 and the wiring patterns for releasing heat 702 (702aa and 702bb).

The main difference between the fourth embodiment and this embodiment is in that this configuration allows the heat generated from the semiconductor device 709 to release not only by the first mixture 705 but also by the thermal via conductor 708. Hereinafter, each configuration will be described.

The mixtures 705, 706, forming the insulating substrate 701, include a mixture of an inorganic filler and a thermosetting resin. An example of the inorganic filler includes $Al_2O_3$, MgO, BN, AlN, and $SiO_2$. It is desirable in the first mixture 705 that a high density, i.e., 70 weight % to 95 weight % of an inorganic filler is contained. On the other hand, it is desirable in the second mixture 706 that 50 weight % to 90 weight % of an inorganic filler is contained. Furthermore, it is desirable that the second mixture 706, which is in uncured state, has a low viscosity so that it can be injected into the connecting portion 702c between the semiconductor device 709 and the wiring pattern 702a as a sealing resin. However, an uncured sheet having a low viscosity may be used for the second mixture 706 covering the semiconductor device 709 and the wiring pattern 702a. The weight of the inorganic filler forming the uncured sheet is not limited to 50 weight % to 90 weight % and up to 95 weight % of an inorganic filler may be included.

The average particle diameter of each inorganic filler is desirably 0.1 $\mu$m to 100 $\mu$m. Desirable examples of the thermosetting resin include an epoxy resin, a phenol resin, a cyanate resin, or a polyphenylene ether resin. An epoxy resin is particularly desirable because of its high heat resistance. Each mixture further may include a dispersant, a coloring agent, a coupling agent or a releasing agent.

Since the wiring patterns 702a, 702b, and 702c are the same as the wiring patterns 102a and 102b, which are described in the first embodiment, the same explanation is not repeated herein.

In this embodiment, similar to the fourth embodiment mentioned above, the wiring pattern 702a is protected by the second mixture 706 and then buried in the first mixture 705. Therefore, even if a fine line having line/space of 50 $\mu$m/50 $\mu$m or more is formed, disconnection, etc. does not occur after the wiring pattern 702a is buried. Thus, the wiring pattern 702a is not damaged.

The connection portion 702c between the wiring pattern 702a and the semiconductor device 709 uses, for example, a flip chip bonding.

Since the inner via conductors 704 are the same as the inner via conductors 104 described in the first embodiment mentioned above, the explanation is not repeated herein.

The thermal via conductors 708 include, for example, a thermosetting conductive substance. For example, a conductive resin composition mixing a metal particle and a thermosetting resin can be used for the thermal via conductor 708. An example of the metal particle material includes silver, copper, etc., which has a high thermal conductivity. Unlike the inner via conductor, since the thermal via conductor provides the thermal conductivity, it is desirable that the thermal via conductor has a diameter that is larger than that of the inner via conductor, and the content of the metal particle is higher than that of the inner via conductor. However, they may be equal to those of the inner via conductor.

In the circuit component built-in module 700 shown in FIG. 7, the wiring patterns 702a and 702b are buried in the insulating substrate 701. However, the wiring patterns 702a and 702b are not required to be buried in the insulating substrate 701. In this embodiment, since the heat generated in the semiconductor device 709 is released by the thermal via conductor 708, it is possible to suppress the heat increase of the chip.

In this embodiment, the configuration having a two-layered wiring pattern is described. However, the wiring pattern is not limited to a two-layer structure, and a single layer structure may be used.

Eighth Embodiment

One embodiment of a method for producing the circuit component built-in module described in the seventh embodiment will be described with reference to the eighth embodiment. The materials and the circuit components used in this embodiment are the same as those described in the seventh embodiment.

FIGS. 8A to 8I are cross-sectional views showing a method for producing the circuit component built-in module of this embodiment.

First, as shown in FIG. 8A, a wiring pattern 801 made of, for example, a copper foil, is formed on a mold release film 805a.

Then, as shown in FIG. 8B, a layer electrolytically plated with, for example Ni and Au, is formed on the wiring pattern 801.

Then, as shown in FIG. 8C, an active component, for example, a semiconductor chip 804 is mounted on the wiring pattern 802 via a connection portion 803b. The method for mounting the semiconductor chip 804 is the same as in FIG. 2A and 2B, and the same explanation is not repeated herein.

Then, as shown in FIG. 8D, sealing is performed by injecting the second mixture 810 not only in the connection portion 803b but also in the entire region of the wiring patterns 801 and 802 connected to the semiconductor chip 804. This injection of the sealing resin makes it possible to prevent the generation of a gap between the semiconductor chip 804 and the wiring patterns 801 and 802, the disconnection of the wiring patterns 801 and 802, and the distortion of the wiring patterns 801 and 802, and the like. An underfill resin, which is used for a general flip chip bonding, can be used for the second mixture 810 used as a sealing resin.

Then, as shown in FIG. 8F, by processing the mixture of an inorganic filler and a thermosetting resin in a form of a plate, a first mixture 800 is formed into a plate. Thereafter, through-holes for the thermal via conductors 807 are pierced in the direction of the thickness by using a laser, etc. into the first mixture 800. In this case, in order to conduct the heat sufficiently, a through-hole for a thermal via conductor 807 having a relatively large diameter, for example, a diameter of 0.5 mm is pierced.

Thereafter, the semiconductor chip 804 mounted on the mold release film 805a is buried in the first mixture 800. This process is the same as in FIG. 2C, and the same explanation is not repeated herein. The wiring patterns 801, 802 and the semiconductor chip (active component) 804 are sealed by the second mixture 810 so that they are in a completely coated and protected state.

Then, as shown in FIGS. 8H and 8J, through-holes 808 for the inner via conductors are formed in the predetermined position by recognizing the position of the wiring patterns by a method using an X-ray, etc. The conductive resin composition 809 is filled in the through holes 808 for the inner via conductor and at the same time, the conductive resin composition 811 in the through-holes 807 for the thermal via conductor. The conductive resin composition 811 for the through hole for the thermal via conductor desirably employs high density composition including 90 weight % or more of metal particles. Since the above-mentioned processes are the same as in FIGS. 2E and 2F, the same explanation is not repeated herein.

In parallel to the processes of FIGS. 8D to 8F, as shown in FIG. 8I, two layered-structures of wiring patterns 816 and 817 are formed on the mold release film 805b.

Then, as shown in FIG. 8J, the mold release film 805b on which two layered structure of wiring patterns 816 and 817 formed is superimposed on the surface of the first mixture 800 in a suitable position so that two layers of the wiring patterns 816 and 817 are connected to the conductive resin compositions 809 and 811 at the predetermined portion.

Thereafter, as shown in FIGS. 8J and 8K, the first mixture 800 on which the mold release film 805b having two-layer structured wiring patterns 816 and 817 is superimposed in a suitable position, is pressed from the outside of the mold release film 805b and heated. Thereby, the thermosetting resin in the first mixture 800, the second mixture 810 and the conductive resin composition 809, 811 is cured. Thus, a plate is formed in which the semiconductor chip 804, and the wiring patterns 816 and 817 are buried in the first mixture 800.

The heating is performed at a temperature equal to or higher than a temperature at which the thermosetting resin in the first mixture 800, the second mixture 801 and the conductive resin composition 809 and 811 is cured (e.g., 150° C. to 260° C.). Thus, the mixtures 800 and 810 serve as an insulating substrate 815, the conductive resin composition 809 serves as an inner via conductor 813 and the conductive resin composition 811 serves as a thermal via conductor 814.

Thereafter, as shown in FIGS. 8K and 8J, the mold release films 805a and 805b are peeled from the insulating substrate 815.

In the circuit component built-in module formed as mentioned above, the wiring patterns 801, 802 are electrically connected to the wiring patterns 816, 817 by the inner via conductors 813. Furthermore, since the electrolytic plated Ni, Au layer 802 is intervened between the inner via conductor 813 and the copper foil wiring pattern 802, the connection reliability between the inner via conductor 813 and the copper foil wiring pattern 802 is improved. Furthermore, since the thermal via conductor 814 allows the heat generated at the semiconductor chip 804 to release by way of the two-layer structured wiring patterns 816 and 817, the increase of heat of the semiconductor chip 804 can be suppressed radically.

In this embodiment, the conductive resin compositions 809, 811 are filled after the semiconductor chip 804 is buried. However, the process is not necessarily limited to this. The conductive resin composition 809, 811 may be filled before the semiconductor chip 804 is buried.

Furthermore, a two-layer structured wiring pattern is described as an example, the wiring pattern may not necessary limited to this and the wiring pattern may have a single layer structure.

Ninth Embodiment

One example of a circuit component built-in module having a multilayer structure of the present invention will be described with reference to the ninth embodiment.

Figure 9A:
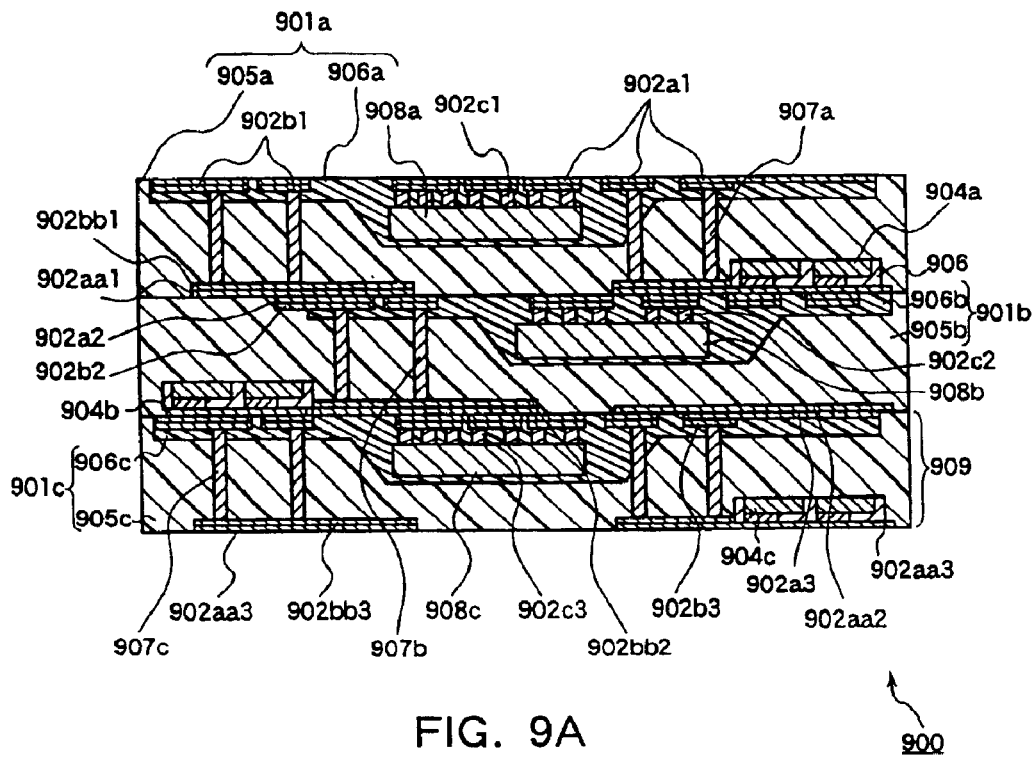
FIGS. 9A and 9B are cross-sectional views showing a configuration of a circuit component built-in module according to a ninth embodiment of the present invention.
Figure 9B:
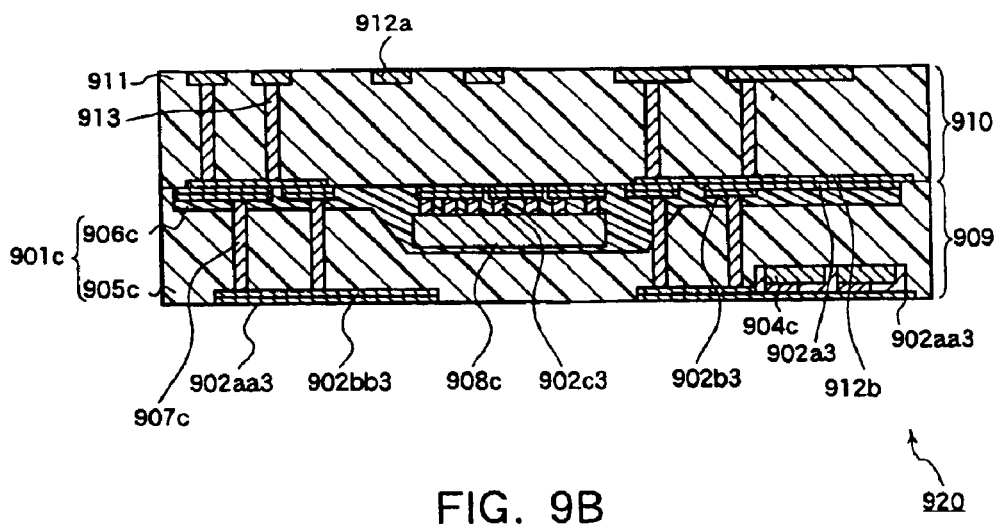

FIGS. 9A and 9B are cross-sectional views of a circuit component built-in module of this embodiment.

As shown in FIG. 9A, the circuit component built-in module 900 of this embodiment includes an insulating substrate 901 including laminated insulating substrates 901a, 901b and 901c (each is formed of two kinds of mixture layers 905 and 906); wiring patterns 902a1 and 902b1, 902aa1 and 902bb1, 902a2 and 902b2, 902aa2 and 902bb2, 902a3 and 902b3, and 902aa3 and 902bb3, each having a two-layered structure, formed on the principal surface and the internal portion of the insulating substrate 901; circuit components 908a, 908b and 908c connected to the wiring pattern 902a1 and 902b1, 902a2 and 902b2, and 902a3 and 902b3 via connection portions 902c1, 902c2 and 902c3; circuit components 904a, 904b, and 904c connected to the wiring patterns 902aa1, 902aa2, and 902aa3; and inner via conductors 907a, 907b and 907c electrically connecting to these wiring patterns.

Not shown in this figure, it is preferable that the region excluding the external lead electrode of the wiring patterns 902a1 formed on the principal surface is covered with a protective film such as a resist, etc. According to such a configuration, it is possible especially to make the bump connection right above the semiconductor chip 908a.

The insulating substrates 901a, 901b, and 901c include two kinds of mixtures (first and second mixtures) having a different amount of an inorganic filler. These two kinds of mixtures include an inorganic filler and the thermosetting resin. Since specific components are the same as in the above-mentioned embodiments, the same explanations are not repeated herein.

Since the wiring patterns 902a1, 902b1, 902aa1, 902bb1, 902a2, 902b2, 902aa2, 902bb2, 902a3, 902b3, 902aa3 and 902bb3 are the same as in the wiring patterns 702a, 702b, 702aa, and 702bb, the same explanation is not repeated herein.

The circuit components 908a, 908b, and 908c are active components, and the circuit components 904a, 904b, and 904c are passive components. For example, a semiconductor device such as a transistor, an IC, an LSI, and the like, are used for the positive component. A chip resistor, a chip capacitor, a chip inductor, or the like, can be used for the passive component. The circuit component built-in module of this embodiment may not include the passive component (circuit components 904a, 904b, and 904c).

The connection portion 902c1 circuit component 908a that is an active component and the wiring patterns 902a1, 902b1 uses, for example, a flip chip bonding.

The inner via conductors 907a, 907b, and 907c are formed of for example, a thermosetting conductive substance. For example, a conductive resin composition including metal particles and a thermosetting resin can be used for the thermosetting conductive material. The metal particles and the thermosetting resin are the same as in the embodiments mentioned above, and the same explanation is not repeated herein.

In the circuit component built-in module 900 shown in FIG. 9A, the wiring patterns 902a1, 902b1, etc. are buried in the insulating substrate 901a, etc. However, the wiring patterns 902a1, 902b1, etc. may not be buried in the insulating substrate 901a, etc.

Although FIG. 9A shows the circuit component built-in module 900 having a three-layered structure, a structure having any number of layers can be formed depending on the design.

FIG. 9B shows another example of the circuit component built-in module of this embodiment.

In the circuit component built-in module shown in FIG. 9B, a double-sided two-layered wiring substrate 910 is laminated on the wiring substrate having the same configuration as that of the lowest layer 909 of the three-layered wiring substrate shown in FIG. 9A. In the double-sided two-layered wiring substrate 910, the wiring patterns 912a and 912b are formed on both sides of the insulating substrate 911, and these wiring patterns are connected to each other by inner via conductors 913.

This configuration makes it easy to perform re-wiring, and thus the configuration of the electrode such as an LGA can be formed easily. In addition, the connection portion 902c3 between the circuit component 908c and wiring pattern 902a3, 902b3 is constrained by the substrate. Therefore, the module has a highly reliable interlayer connection.

In this embodiment, the configuration having a two-layered wiring pattern is described. However, the wiring pattern is not limited to a two-layer structure and a single layer structure may be used.

Tenth Embodiment

A method for producing the circuit component built-in module shown in FIGS. 1, 4, 7, and 9 will be described with reference to this embodiment. In particular, a method for mounting a circuit component on the mold release carrier will be described. Therefore, the producing method used in this embodiment is effective for the first to ninth embodiments mentioned above.

FIGS. 10A to 10I are cross-sectional views showing a method for producing a circuit component built-in module in the tenth embodiment.

Figure 10A:
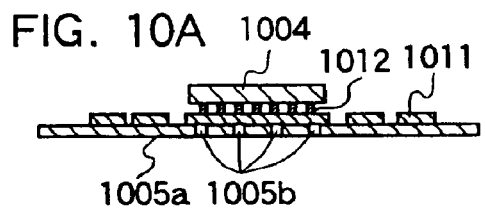
FIGS. 10A to 10I are cross-sectional views showing a process for producing a circuit component built-in module according to a tenth embodiment of the present invention.

First, as shown in FIG. 10A, a copper foil wiring pattern 1011 is formed on a mold release film (a mold release carrier) 1005a provided with penetrating holes 1005b and a circuit component, for example, a semiconductor chip 1004, is flip-chip bonded thereon. The region without a wiring portion directly beneath the semiconductor chip 1004 is provided with one or more relatively large holes, so that sealing resins can be injected easily. As the mold release film 1005a, an organic film having a predetermined adhesive strength, for example, polyethylene terephthalate, polyphenylene sulfide, etc. may be used. Furthermore, a metal foil such as a copper foil may be used. In particular, when the wiring pattern is not covered with the second mixture, if the resin film is used as the mold release carrier, the wiring pattern may be stretched and cut off when buried. Therefore, a metal foil carrier is preferred. The wiring pattern 1011 can be formed, for example, through a photolithography process or an etching process, after copper foil is adhered onto the mold release film 1005a. Furthermore, a lead frame produced by etching or punching may be used for the wiring pattern 1101.

A semiconductor chip 1004 is electrically connected to the copper foil pattern 1011 via a conductive adhesive 1012. As the conductive adhesive 1012, for example, a mixture formed by mixing and kneading a thermosetting resin with gold, silver, copper, or a silver-palladium alloy can be used. Instead of the conductive adhesive 1012, a gold bump produced by a gold wire bonding or a solder bump may be formed on the side of the semiconductor chip 1004 beforehand. In this case, the gold or the solder may be dissolved by a heat treatment so that the semiconductor chip 1004 can be mounted. Furthermore, the solder bump can be used together with the conductive adhesive.

Figure 10B:
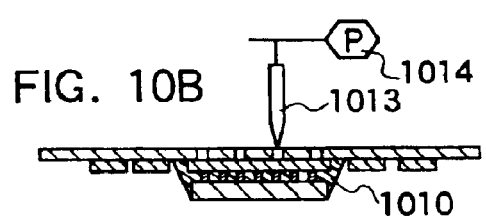
Figure 10C:
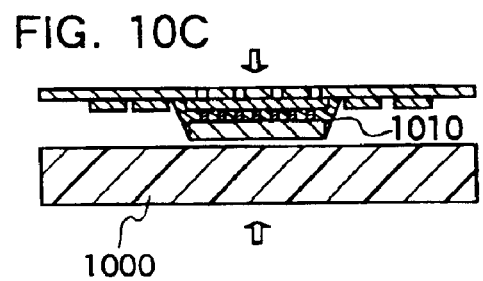
Figure 10E:
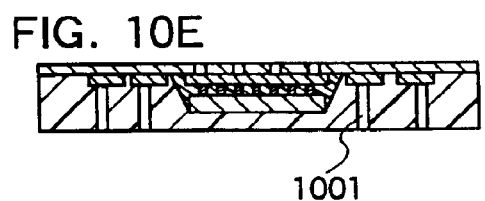
Figure 10D:
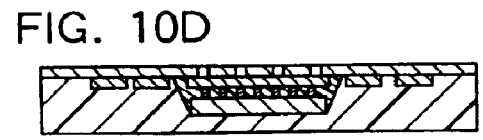
Figure 10F:
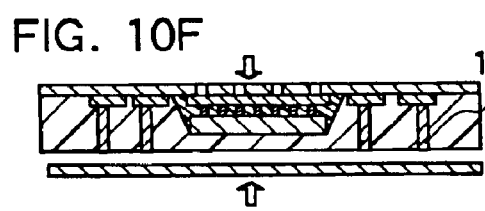
Figure 10G:
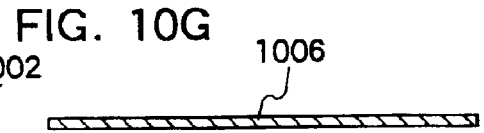
Figure 10H:
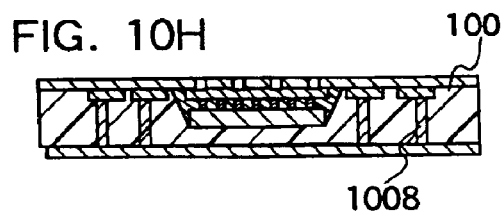
Figure 10I:
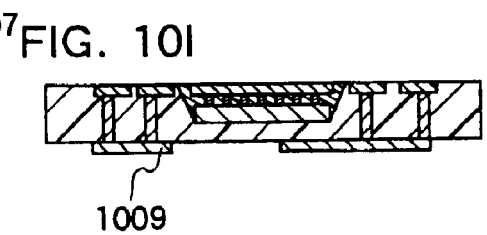

Thereafter, as shown in FIG. 10B, a sealing is performed by injecting the second mixture 1010 between the copper foil wiring pattern 1011 and the semiconductor chip 1004. In general, injection is performed from the rear side of the semiconductor chip 1004. However, in this embodiment, the injection is performed by an injector 1013 connected to a pump 1014 from the opposite side of the mold release film (mold release carrier) 1005a via a penetrating through-hole 1005 formed on the carrier surface. Therefore, it is possible to inject the second mixture (a sealing resin) 1010, which was difficult to inject because of its adhesiveness. Thus, by injecting the second mixture (sealing resin) 1010, it is made possible to prevent the generation of gap between the semiconductor chip 1004 and the wiring pattern 1101. An underfill resin used in a general flip chip bonding can be used for the mixture 1010, i.e., the sealing resin. However, in this embodiment, it is possible to substitute the resin including a large amount of inorganic filler and having a high accuracy.

Since the processes after the semiconductor chip 1004 is buried in the sheet body 1000 (see FIGS. 10C to 10I) are the same as in the second embodiment, the same explanation is not repeated herein.

Eleventh Embodiment

A circuit component built-in module according to this embodiment has a configuration in which a multilayer wiring substrate is laminated onto the circuit component built-in module described in the embodiments mentioned above. In particular, when a ceramic multilayer wiring substrate is used as a multilayer wiring substrate, it is possible to realize an RF module having a high frequency property and function of the ceramic multilayer wiring substrate.

FIGS. 12A to 12D show the configurations of the circuit component built-in module of this embodiment in the order of the process.

Figure 12A:
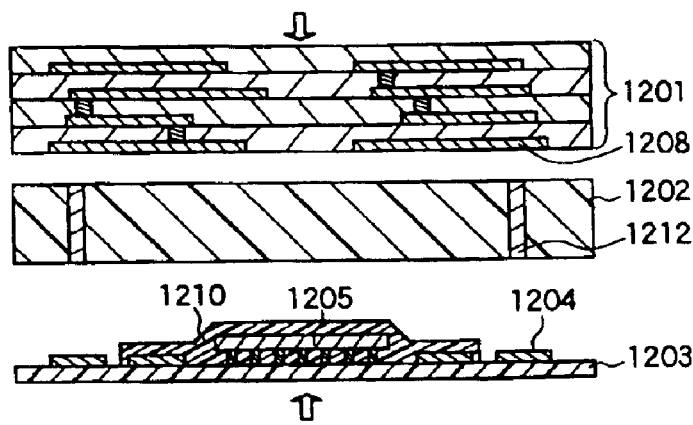
FIGS. 12A to 12D are cross-sectional views showing a process for producing a circuit component built-in module according to an eleventh embodiment of the present invention.
Figure 12B:
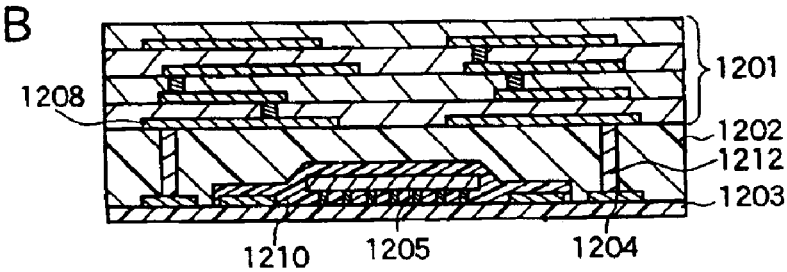

First, as shown in FIG. 12A, a ceramic multilayer substrate 1201 having a wiring pattern 1208 on one principal surface, a first mixture plate 1202 and the mold release carrier 1203 are brought into contact so as to form into a plate shown in FIG. 12B.

Furthermore, as shown in FIG. 12A, the first mixture plate 1202 is provided with inner via conductors 1212 beforehand, as described in the second embodiment. On the mold release carrier 1203, the wiring pattern 1204 is formed, and the semiconductor chip 1205 is mounted and sealed with the second mixture 1210.

Furthermore, it is preferable that the mold release carrier 1203 is provided with a plurality of holes as in FIG. 11A in the second embodiment. Thus, as shown in FIG. 11D, when the semiconductor chip 1205 is buried into the first mixture 1202, excess mixture is ejected from the holes, and the distortion of the inner via conductors 1212 is radically reduced.

Figure 12C:
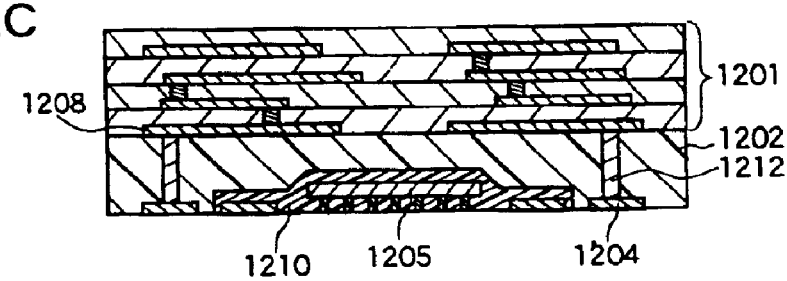
Figure 12D:
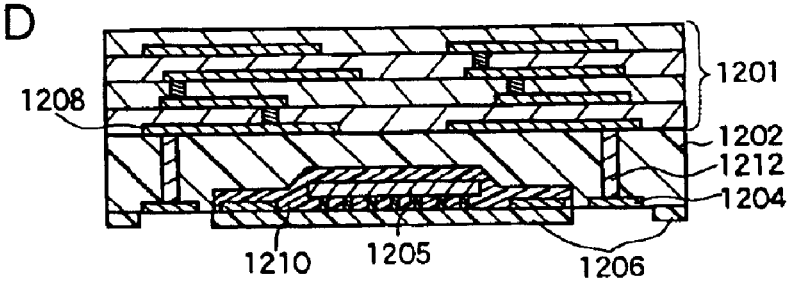

Next, after the mold release carrier 1203 is peeled off as shown in FIG. 12C, a resist 1206 is formed on the region excluding the external lead electrode (in particular, a point of the wiring pattern directly connected to the semiconductor chip 1205) in the wiring patterns 1204 connected to the semiconductor chip 1205 as shown in FIG. 12D. Thereby, the wiring is constrained and the configuration has a connection reliability.

Herein, an example in which the inner via conductors are formed before the circuit component is buried in order to facilitate the processes is shown. However, the configuration is not necessary limited to this. After the circuit component is buried, the inner via conductors may be formed by forming through-holes. Also, when it is possible to secure a sufficient distance between the circuit component and the inner via conductor, a mold release carrier without holes may be used as a mold release carrier 1203.

Furthermore, depending on the applications of use, instead of the ceramic multi-layer wiring substrate, a resin multilayer wiring substrate such as FR-4, etc. may be used.

Twelfth Embodiment

Similar to the eleventh embodiment, a circuit component built-in module according to this embodiment has a configuration in which a multilayer substrate is laminated onto the circuit component built-in module described in the first to tenth embodiments.

However, in the circuit component built-in module of this embodiment, the wiring pattern connecting to the circuit component is sealed by the multilayer wiring substrate, while in the circuit component built-in module of the eleventh embodiment, the wiring patterns connecting to the circuit component are formed on the opposite side to the interface to the multilayer wiring substrate.

A configuration and the producing method of the circuit component built-in module of this embodiment will be described with reference to FIGS. 13A to 13E.

Figure 13A:
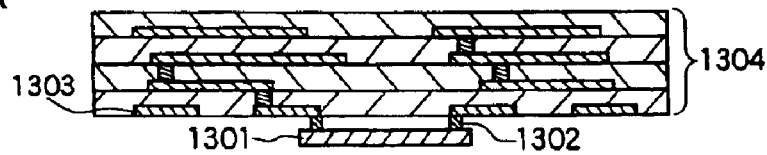
FIGS. 13A to 13E are cross-sectional views showing a process for producing a circuit component built-in module according to a twelfth embodiment of the present invention.

First, as shown in FIG. 13A, a ceramic multilayer wiring substrate 1304 is prepared as a multilayer wiring substrate, and a bare semiconductor chip 1301 as a circuit component is mounted on the ceramic multilayer wiring substrate 1304.

In this case, a connection bump 1302 is formed on the wiring pattern 1303 formed on one principal surface of the ceramic multilayer wiring substrate 1304. Then, the bare semiconductor chip 1301 is connected to the connection bump 1302.

Figure 13B:
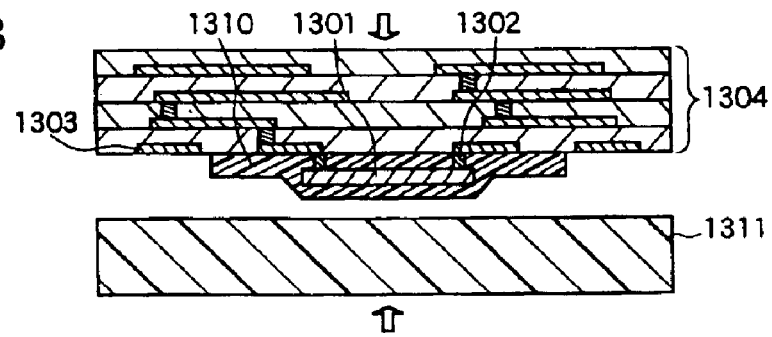

Thereafter, as shown in FIG. 13B, at least the connection portion between the wiring patterns 1303 and the bare semiconductor chip 1301 is sealed with the second mixture 1310. At this time, it is preferable that not only the connection portion but also a part of an entire portion of the wiring pattern 1303 is sealed with the second mixture 1310. For example, in the specific example shown in FIG. 13B, among the wiring pattern 1303, only the region on which the connection bump 1302 is formed is sealed with the second mixture 1310. However, the configuration is not particularly limited to this, and an entire portion of the wiring pattern 1303 may be sealed with the second mixture 1310.

Similarly, as shown in FIG. 13B, the ceramic multilayer substrate 1304 on which the bare semiconductor chip 1301 is mounted is superimposed on an uncured first mixture 1311 that is formed in a plate in a suitable position, and pressured so as to bury the bare semiconductor chip 1301 into the first mixture 1311.

Figure 13C:
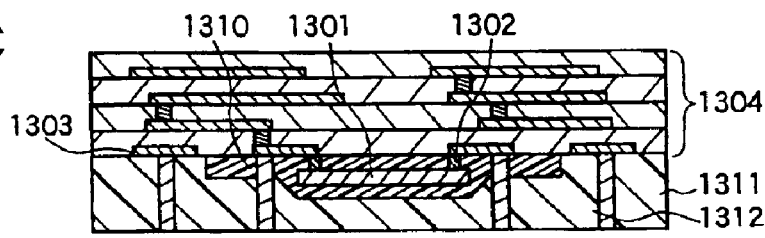

Then, as shown in FIG. 13C, through-holes penetrating to the wiring pattern 1303 are formed in the first mixture 1311 and a conductive substance is injected into the through-holes. Thus, the inner via conductors 1312 are formed.

Figure 13D:
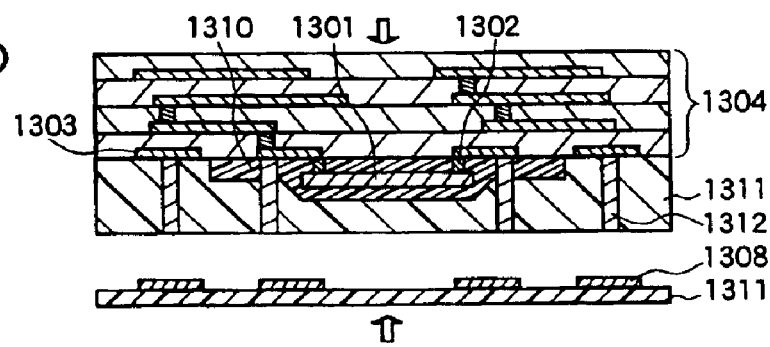

Thereafter, as shown in FIG. 13D, a wiring pattern 1308 is formed on the mold release carrier 1311 formed of, for example, a resin film. The mold release carrier 1311 is superimposed on the first mixture 1311 and pressed and heated so as to bury the wiring pattern 1308 into the first mixture 1311. Then, the mold release carrier 1311 is peeled off. Thus, as shown in FIG. 13E, a circuit component built-in module is completed.

This circuit component built-in module serves as an RF module having an excellent high frequency property and function of ceramics by employing the ceramic multilayer wiring substrate 1304.

Figure 13E:
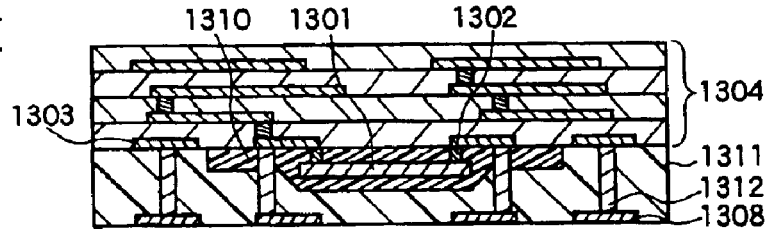
Figure 14:
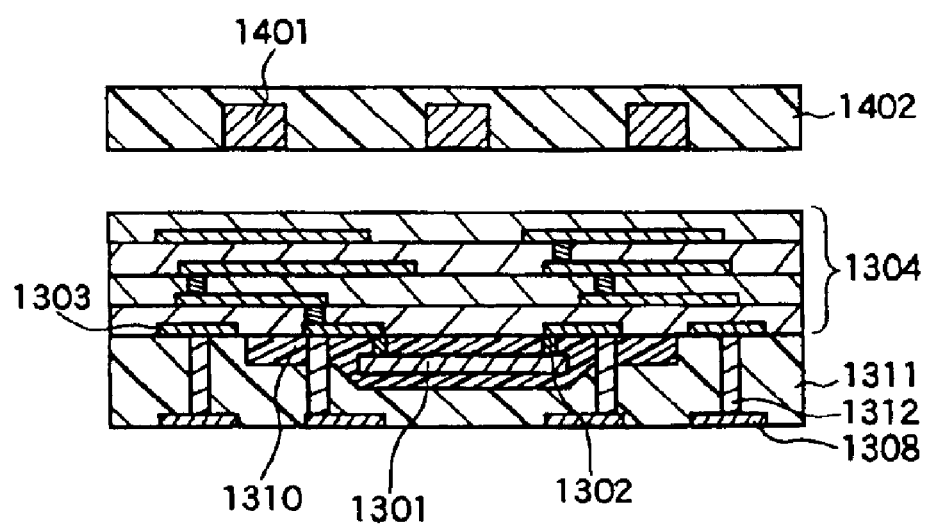
FIG. 14 is a cross-sectional view showing another configuration of a circuit component built-in module according to the twelfth embodiment of the present invention.

Furthermore, as shown in FIG. 14, the finished circuit component built-in module shown in FIG. 13E may have a configuration in which a passive component 1401, and the like, such as an inductor, a resistor, a capacitor, etc. are connected to the wiring pattern (not shown) on the surface layer of the ceramic multilayer wiring substrate 1304, and they are sealed within the resin layer 1402. By making the surface of the resin layer 1402 smooth, a circuit component built-in module having an excellent mounting property can be attained. Moreover, instead of the resin layer 1402, a resist may be used.

The circuit component built-in module of this embodiment has a configuration in which a wiring pattern 1303 and connection bump 1302 connecting to the bare semiconductor chip 1301 are constrained between the ceramic multilayer wiring substrate 1304 and the first mixture 1311 or the second mixture 1310. Therefore, the module of this embodiment exhibits a stable connection and high reliability such as a heat cycle, etc.

In this embodiment, ceramic multilayer wiring substrate is used as a multilayer wiring substrate. Depending upon the application of use, instead of the ceramic multilayer substrate, a resin substrate such as an FR-4 may be used. Furthermore, a bare semiconductor chip is used as an example of a circuit component. However, other active component or passive component may be used.

Furthermore, in a method of this embodiment, after the bare semiconductor chip 1301 is buried in the first mixture 1311, then the inner via conductors 1312 are formed. The method for forming the inner via conductors is not necessarily limited to this. In other words, when the distance between the circuit component and the inner via conductor is secured, before the circuit component is buried, the inner via conductors may be formed in the uncured first mixture. Also, if the mold release carrier having holes as shown in FIG. 11A in the second embodiment is used, when the wiring patterns are buried, an excess portion of the first mixture can be ejected from the hole, thus reducing the distortion of the inner via conductor or wiring pattern.

Thirteenth Embodiment

One embodiment of a radio device according to the present invention will be described.

Figure 15:
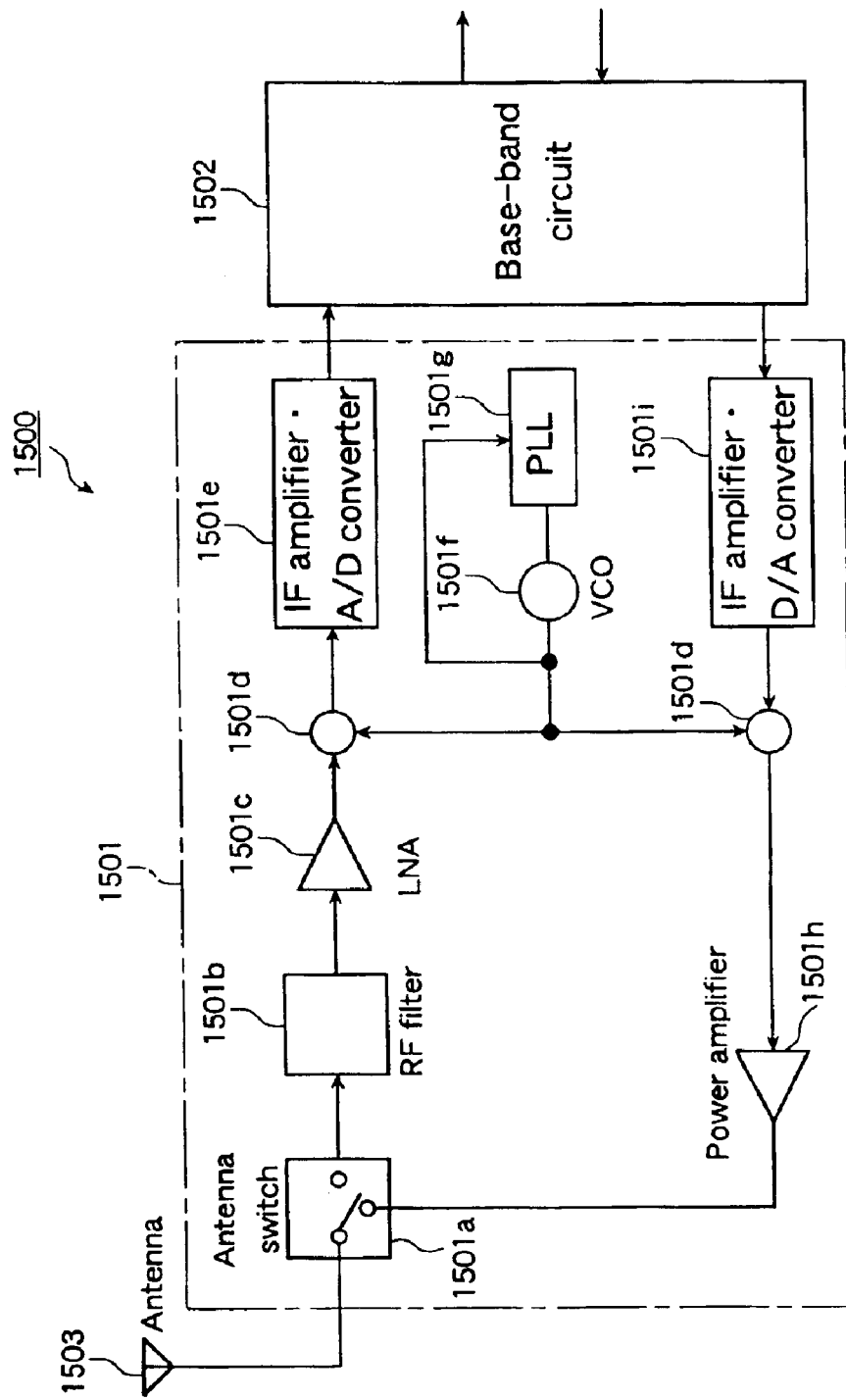
FIG. 15 is a block diagram showing a configuration of a radio device according to the thirteenth embodiment of the present invention.

As shown in FIG. 15, the radio device 1500 of this embodiment includes a high frequency analog circuit 1501, a base-band circuit 1502 and an antenna 1503.

The high frequency analog circuit 1501 includes an antenna switch 1501*a*, an RF filter 1501*b*, an low notice amplifier (LNA) 1501*c*, mixers 1501*d*, an IF amplifier. A/D converter 1501*e*, a voltage controlled oscillator (VCO) 1501*f*, a phase-looked loop (PLL) 1501*g*, an IF amplifier. D/A converter 1501*i* and a power amplifier 1501*h*. The base-band circuit 1502 performs a digital signal processing such as base-band modulation, correction, and the like.

In this radio device, each of circuit components of high frequency analog circuit 1501 can be constituted by the circuit component built-in module described in the first to twelfth embodiments. In particular, when the RF module having the ceramic multilayer wiring substrate described in the eleventh or twelfth embodiment is used, a high performance radio device can be obtained because of an excellent high frequency property of ceramics.

Moreover, for example, a plurality of circuit components such as a combination of, for example, VCO 1501f and PLL 1501g, can be built in one module. By enhancing the degree of integration to the maximum, it is possible to form an entire high frequency analog circuit 1501 into one circuit component built-in module.

EXAMPLES

Hereinafter, the present invention will be described in detail by way of examples.

Example 1

In this example, in the production of a circuit component built-in module of the present invention, an example of a method for producing an insulating substrate formed of two mixtures including an inorganic filler and a thermosetting resin will be described.

In this example, the first mixture forming an insulating substrate was produced with the composition shown in Table 1. Sample 1 in Table 1 is a comparative example.

In this example, an epoxy resin manufactured by Nippon Pelnox (WE-2025) was used for the liquid epoxy resin. A phenol resin manufactured by Dainippon Ink and Chemicals, Inc. (Fenolight, VH-4150) was used for the phenol resin. A cyanate resin manufactured by Asahi Ciba (AroCy, M-30) was used for the cyanate resin. In this example, carbon black or a dispersant was added as an additive.

A first mixture was produced in the following manner. First, a predetermined amount of a paste mixture obtained by mixing the composition shown in Table 1 was dropped onto a mold release film. The paste mixture was prepared by mixing an inorganic filler and a liquid thermosetting resin with an agitator for about 10 minutes. The agitator used in this example operates in such a manner that an inorganic filler and a liquid thermosetting resin are placed in a container, and the container itself rotates so as to stir the mixture in the container. The mixture obtained by using this agitator is dispersed sufficiently, even if the mixture has a relatively high viscosity. A polyethylene terephthalate film having a thickness of 75 $\mu$m was used for the mold release film, and the surface of the film was subjected to a mold release treatment with silicon.

Next, another mold release film was placed on the paste mixture on the mold release film, and pressing was performed by a pressurizing press so as to form a mixture plate having a thickness of 200 $\mu$m. The excellent mixture plate also was obtained by placing a slurry mixture having a lowered viscosity on the mold release film and molding the slurry into a plate by a doctor blade method.

Next, in order to evaluate various properties of the electric insulating substrate, a cured material of the first mixture plate was formed.

TABLE 1

| | Inorganic filler | *1 | Thermosetting resin | *2 | Additives (wt %) | *3 | *4 | *5 | *6 | *7 |
|---|---|---|---|---|---|---|---|---|---|---|
| 1 | $Al_2O_3$ | 60 | Liquid | 39.8 | Carbon | 0.52 | 45 | 3.5 | 0.3 | 8.1 |
| 2 | $Al_2O_3$ | 70 | epoxy | 29.8 | black | 0.87 | 32 | 4.7 | 0.3 | 10.1 |
| 3 | $Al_2O_3$ | 80 | resin | 19.8 | (0.2) | 1.2 | 26 | 5.8 | 0.3 | 16.5 |
| 4 | $Al_2O_3$ | 85 | WE-2025 | 14.8 | | 2.8 | 21 | 6.1 | 0.2 | 15.5 |
| 5 | $Al_2O_3$ | 90 | | 9.8 | | 4.5 | 16 | 6.7 | 0.2 | 18.7 |
| 6 | $Al_2O_3$ | 95 | | 4.8 | | 5.5 | 11 | 7.1 | 0.2 | 17.1 |
| 7 | MgO | 78 | Liquid | 21.8 | Carbon | 4.2 | 24 | 8.1 | 0.4 | 15.2 |
| 8 | BN | 77 | epoxy | 22.8 | black | 5.5 | 10 | 6.8 | 0.3 | 17.4 |
| 9 | AlN | 85 | resinWE- | 14.8 | (0.2) | 5.8 | 18 | 7.3 | 0.3 | 19.3 |
| 10 | $SiO_2$ | 75 | 2025 | 24.8 | | 2.2 | 7 | 3.5 | 0.2 | 18.2 |
| 10 | $Al_2O_3$ | 90 | Phenol resin | 9.8 | Carbon black (0.2) | 4.1 | 1 | 7.7 | 0.5 | 13.2 |
| 1 | $Al_2O_3$ | 90 | Cyanite resin | 9.8 | Dispersant (0.2) | 3.8 | 15 | 7.3 | 0.2 | 14.5 |

*1 = amount of inorganic filler (weight %)
*2 = amount of thermosetting resin (weight %)
*3 = thermal conductivity (W/m · K)
*4 = coefficient of linear thermal conductivity (ppm/° C.)
*5 = dielectric constant 1 MHz
*6 = dielectric loss 1 MHz (%)
*7 = breakdown voltage (AC) KV/mm
liquid epoxy resin: WE-2025, manufactured by Nippon Pelnox
phenol resin: Fenolight VH-4150, manufactured by Dainippon Ink and Chemicals, Inc.
cyanate resin: AroCy M-30, manufactured by Asahi Ciba
carbon black: R-930, manufactured by Toyo Carbon
dispersing agent: PLYSURF S-208F, manufactured by DAI-ICHI SEIYAKU KOGYO CO., LTD.
$Al_2O_3$: AS-40, manufactured by SHOWA DENKO K.K
$SiO_2$: reagent 1st grade, manufactured by Kanto Kagaku K.K.
AlN: product of DOW CHEMICAL LIMITED
BN: product of Denki Kagaku Kogyo K.K.
MgO: reagent 1st grade, manufactured by Kanto Kagaku K.K.

The cured material can be obtained by pressurizing at 50 kg/cm² and heating at 170° C., and then peeling off the heat resistant mold release film.

After processing the insulating substrate including a hardened material of the first mixture plate into a predetermined size, the thermal conductivity, the coefficient of linear thermal expansion, and the breakdown voltage were measured. The thermal conductivity was obtained in the following manner. A surface of a sample of 10 mm×10 mm was heated in contact with a heater, and the temperature on the portion in contact with a heater and the temperature of the opposite surface were measured. The thermal conductivity was calculated based on the increase in the temperature on the opposite surface. The coefficient of linear thermal expansion was obtained in the following manner. A change in the size of the insulating substrate was measured when the temperature was raised from room temperature to 140° C., and the coefficient of linear thermal expansion was calculated based on the average value of the change. The breakdown voltage was obtained in the following manner. A breakdown voltage was calculated when an AC voltage was applied to the insulating substrate made of the first mixture in the thickness direction, and a breakdown voltage per unit thickness was calculated.

As shown in Table 1, when $Al_2O_3$ was used for the inorganic filler, the insulating substrate produced according to the above-mentioned method had a thermal conductivity of about 10 times or more that of a conventional glass-epoxy substrate (thermal conductivity of 0.2 w/m·K to 0.3 w/m·K). When the content of $Al_2O_3$ was about 85 weight % or more, the thermal conductivity was 2.8 w/m·K or more. $Al_2O_3$ is also advantageous for reducing cost.

When amorphous $SiO_2$ was used for the inorganic filler, the coefficient of linear expansion became closer to that of a silicon semiconductor (a coefficient of linear expansion of $3\times10^{-6}$/° C.). Therefore, the insulating substrate using amorphous $SiO_2$ as the inorganic filler is preferable as a flip chip substrate on which a semiconductor is mounted directly.

Furthermore, when $SiO_2$ was used for the inorganic filler, an insulating substrate having as low a dielectric constant as 3.4 to 3.8 was obtained. $SiO_2$ is advantageous in view of its low specific gravity. A circuit component built-in module using $SiO_2$ as the inorganic filler is desirably used as a high frequency module such as a cellular phone.

When BN was used for the inorganic filler, an insulating substrate having a high thermal conductivity and a low coefficient of linear expansion was obtained.

As shown in Table 1, the breakdown voltages of the insulating substrates of all the samples except sample 1 (the comparative example), which uses 60 wt % of $Al_2O_3$ as the inorganic filler, were 10 kV/mm or more. The breakdown voltage of the insulating substrate serves as an index for the adhesive property between an inorganic filler that is a material of the first mixture and a thermosetting resin. Namely, when the adhesive property between the inorganic filler and the thermosetting resin is poor, a small gap is generated therebetween, thus deteriorating the breakdown voltage. Furthermore, such a small gap deteriorates the reliability of the circuit component built-in module. Generally, a breakdown voltage of 10 kV/mm or more means that the adhesion between the inorganic filler and the thermosetting resin is good. Therefore, it is preferable that the content of the inorganic filler is 70 wt % or more.

Furthermore, when the content of the thermosetting resin is low, the strength of the insulating substrate is lowered. Therefore, it is desirable that the content of the thermosetting resin is 4.8 weight % or more.

Example 2

A case where a circuit component built-in module produced by the method described in the fifth embodiment will be described in this example.

The composition of the first mixture used in this example includes 90 wt % of $Al_2O_3$ (AS-40 manufactured by Showa Denko K. K., average particle diameter of 12 μm), 9.5 wt % of liquid epoxy resin (EF-450 manufactured by Nippon Rec Co. Ltd.), 0.2 wt % of carbon black (manufactured by Toyo Carbon) and 0.3 wt % of a coupling agent (46B, titanate based coupling agent manufactured by Ajinomoto Co., Inc.).

The materials were treated under the same conditions as those in Example 1, so as to produce an uncured plate (thickness of 400 μm).

On the other hand, a copper foil wiring pattern having a thickness of 8 μm was formed on the copper foil for a mold release carrier for the principal surface and the opposite principal surface. In this case, a fine pattern having L/S (line/space) of 75 μm/75 μm was employed. The wiring pattern was formed on the copper foil wiring pattern having a thickness of 8 μm by exposure, developing, and etching. The thickness of the copper foil used for the wiring pattern ranges from 3 μm to 20 μm depending upon applications of use.

The copper foil wiring pattern for the principal surface had been made rough on one side. A conductive adhesive was coated on the rough surface, and the semiconductor device was flip-chip bonded (see FIG. 2A), and superimposed on the plate so that the rough surface of the copper foil faced the plate side. A chip capacitor was mounted on the mold release carrier on the opposite side.

Before the semiconductor was flip-chip bonded and superimposed so that the rough surface of the copper foil faced the plate, a sealing resin including the second mixture was injected so as to bury the whole wiring patterns connecting to the semiconductor and the wiring pattern and a gap between the semiconductor device and the wiring pattern. As the second mixture to be used as the sealing resin, the resin whose constant of thermal expansion was adjusted by selecting materials of inorganic fillers was used. In this Example, the sealing resin including 70 weight % of $SiO_2$ (which includes 80% of fused $SiO_2$ having a small constant of thermal expansion and 20% of crystalline $SiO_2$ having a relatively large constant of thermal expansion) and 30 weight % of thermosetting resin was used.

A sealing resin was injected as follows. More specifically, a hot plate heated to 70° C. was tilted, and the mold release carrier having the copper foil wiring pattern provided with the semiconductor device was mounted on the hot plate. Thereafter, a sealing resin was gradually injected between the semiconductor device and the wiring pattern with an injector. The sealing resin injection between the semiconductor device and the wiring pattern was completed in about several tens seconds. Furthermore, the wiring pattern could be covered easily. As the thermosetting resin (sealing resin), one-component liquid type epoxy resin was used. Similarly, the circumference of the chip capacitor was covered with the sealing resin. Heating was performed at 150° C. for 2 hours to cure the sealing resin.

Since the coefficient of linear expansion of the sealing resin was 110 ppm/° C. that is the middle level between that of the semiconductor device and that of the first mixture, the sealing resin served effectively as a relaxing layer for thermal shock.

After the semiconductor device was flip-chip bonded and superimposed so that the roughened surface of the copper foil faced the plate side, heating and pressing were performed by a hot-press at a temperature of 70° C. and a pressure of 10 kg/cm² for 15 minutes. Since the thermosetting resin in the plate was softened by heating at a temperature below the curing temperature, the semiconductor device was buried into the plate easily. Although the first mixture forming the plate radically flew, neither distortion nor disconnection of the wiring pattern occurred.

On the other hand, as a comparative example, the wiring pattern was formed on the adhesive mold release carrier made of polypropylene and the semiconductor chip was mounted thereon, and sealed with the sealing resin including the second mixture and similarly buried in the plate by the use of the thermal pressing machine. Then, the partial disconnection or distortion on the wiring patterns occurred.

The above mentioned results show that the mold release carrier formed of a metal foil can suppress the deformation due to the stretch of the substrate sheet unlike a polypropylene film. Furthermore, by covering the wiring pattern with the sealing resin including the second mixture, it is possible to protect the wiring pattern when buried.

After the position of the wiring pattern corresponding to the inner via hole was recognized by a method using an X-ray, etc., through-holes (diameter of 0.15 mm) for the inner via conductors were formed by using a carbon dioxide gas laser (see FIG. 5E).

As a comparative example, after the through-holes for the inner via conductors were formed on the plate beforehand, the semiconductor integrated module in which the semiconductor chip was buried was formed. The through-holes were pressed due to the flow of the first mixture forming the plate. Thus, the inner via conductors were deformed or the location was displaced from the predetermined location. As a result, mismatch between the inner via conductors and the wiring pattern occurred.

As mentioned above, a method in which laser processing was performed by the use of the recognition of the wiring pattern after the circuit component such as a semiconductor chip was buried made it possible to form the high performance multilayer substrate module.

A conductive resin composition was filled in the through-holes by a screen printing method (see FIG. 5F). The conductive resin composition was obtained by mixing and kneading 85 wt % of spherical copper particles, 3 wt % of bisphenol A epoxy resin (Epicoat 828 manufactured by Yuka Shell Epoxy), 9 wt % of glycidyl ester based epoxy resin (YD-171 manufactured by Toto Kasei), and 3 wt % of amine adduct hardening agent (MY-24 manufactured by Ajinomoto Co., Inc.).

Then, the chip capacitor that was formed beforehand on the copper foil mold release carrier was heated and pressed by a hot-press at a temperature of 170° C. and a pressure of 10 kg/cm² for 30 minutes. Since the chip capacitor has much smaller volume than that of the semiconductor chip, it can buried further easily. Moreover, the shape of the inner via conductor was hardly distorted. This heating allowed the epoxy resin in the plate and epoxy resin in the conductive resin composition to be cured, so that the semiconductor device and the copper foils and the plate were strongly connected mechanically. Furthermore, this heating also allowed the conductive resin composition and the copper foils to be connected electrically (inner-via connection) and mechanically.

Then, a copper foil for the mold release carrier was peeled from the plate (see FIG. 5J). The copper foil for the mold release carrier has a heat resistance against the heating temperature or higher. Furthermore, the rough surface of the copper foil wiring pattern is adhered to the plate and inner via conductor and a bright surface is adhered to the copper foil for a mold release carrier. Therefore, the adhesive strength of the plate and the inner via conductor to the copper foil wiring pattern is greater than the adhesive strength of the copper foil for the mold release carrier to the copper foil wiring pattern. Therefore, it is possible to peel off only the copper foil for a mold release carrier.

Finally, a region excluding the external lead electrode for evaluation is covered with a resist and formed into a shape so as to constrain the wiring pattern.

Through the above-mentioned processes, the circuit component built-in module was produced.

First, the connection resistance of the bump of the semiconductor mounted on the mold release carrier and the capacitance of the chip capacitor were measured and these measurement values were compared with the measurement values after buried in the substrate (plate). As a result, it was confirmed that the connection resistance measured by the wiring pattern terminal connected to the bump was substantially the same as the measurement value before buried (i.e. 40 m Ω). Similarly, it was confirmed that the capacitance property of the chip capacitor was neither damaged nor changed.

Then, in order to evaluate the reliability of the circuit component built-in module, a solder reflow test and a temperature cycling test were performed. The reflow test was performed for ten times at a maximum temperature of 260° C. for ten seconds by using a belt type reflow tester. The temperature cycling test was performed for 200 cycles at a temperature of −60° C. for 30 minutes after maintained at 125° C. for 30 minutes.

In both solder reflow test and the temperature cycling test, no cracks occur in the circuit component built-in module of this Example. Also, no abnormality was found by the use of an ultrasonic test equipment. This shows that the semiconductor device, chip capacitor and insulating substrate are adhered strongly. Furthermore, the resistance value of the inner via connection with the conductive resin composition was hardly changed between before and after the test.

In this example, the wiring pattern formed on the principal surface was constrained by using a resist. However, when the wiring pattern was covered with a sealing resin (underfill, epoxy resin with silica dispersed) also had a sufficient reliability.

On the other hand, in the circuit component built-in module in which the wiring pattern was not covered with a resist or a sealing resin, the bump connection resistance became 10 times or more in several places during the temperature cycling test. This shows the effectiveness of the constrained layer.

Example 3

This example refers to a case where the circuit component built-in module is produced by the method described in the sixth embodiment.

In this Example, a semiconductor device and chip components were used for the circuit component.

The composition of the first mixture used in this example includes: 90 weight % of $Al_2O_3$ (AS-40 manufactured by SHOWA DENKO K.K., an average particle diameter of 12 $\mu$m), 9.5 weight % of an liquid epoxy resin (EF-450 manufactured by Nippon Rec Co. Ltd.), 0.2 weight % of carbon black (manufactured by Toyo Carbon) and 0.3 weight % of a coupling agent (46B, titanate based coupling agent manufactured by Ajinomoto Co., Inc.).

First, a predetermined amount of an uncured first mixture mixing the above-mentioned compositions was dropped onto the mold release film. In this case, processing into a plate was not performed.

On the other hand, a copper foil wiring pattern having a thickness of 18 μm was formed on, for example, the copper foil for the mold release carrier with a peel layer made of an organic layer for the principal surface and the opposite principal surface. In this case, a fine pattern having L/S of 75 μm/75 μm was employed. The wiring pattern was formed on the copper foil wiring pattern having a thickness of 18 μm by exposure, developing, and etching.

The copper foil wiring pattern for the principal surface has a surface, which had been made rough, on one side. A conductive adhesive was coated on the rough surface, the semiconductor device was flip-chip bonded (see FIG. 6A) and superimposed on the plate so that the rough surface of the upper foil faced the plate side. On the mold release carrier on the opposite side, a chip capacitor was mounted.

Before the semiconductor was flip-chip bonded and superimposed so that the rough surface of the copper foil wiring pattern faced the plate side, a sealing resin (the second mixture) was injected so as to fill the gap between the semiconductor device and the wiring pattern. As the second mixture to be used as the sealing resin, the resin whose constant of thermal expansion was adjusted by selecting materials of inorganic fillers was used. In this Example, the sealing resin including 70 weight % of $SiO_2$ (which includes 80% of fused $SiO_2$ having a small constant of thermal expansion and 20% of crystalline $SiO_2$ powder having a relatively large constant of thermal expansion) and 30 weight % of thermosetting resin was used. In this case, one-component liquid epoxy resin was used.

A sealing resin was injected as follows. More specifically, a hot plate heated to 70° C. was tilted, and the mold release film with a peel layer having the copper foil wiring pattern provided with the semiconductor device was mounted on the hot plate. Thereafter, a sealing resin gradually was injected between the semiconductor device and the wiring pattern with an injector. The sealing resin was injected between the semiconductor device and the wiring pattern in about several tens of seconds.

On the other hand, an uncured sheet including a second mixture was formed on the mold release film by a doctor blade method. As the second mixture to be used for the sheet, similar to the sealing resin, a slurry mixing 70 weight % of $SiO_2$ (which includes 80% of fused $SiO_2$ having a small constant of thermal expansion and 20% of crystalline $SiO_2$ having a relatively large constant of thermal expansion) and 30 weight % of thermosetting resin was used. The thickness of this sheet was set to be about 10 μm.

The entire wiring pattern together with the mold release carrier was covered with this sheet and pressed slightly, and then the mold release carrier was peeled off. Then heating is carried out at 150° C. for about one hour. Alternatively, the mold release carrier could be peeled off after heating without problems.

Furthermore, the circumference of the chip capacitor also was covered with the sealing resin, and heated at 150° C. for 2 hours.

Since the coefficient of linear expansion of the second mixture used for the sealing resin was 110 ppm/° C. that was the middle level between that of the semiconductor device and that of the first mixture, the sealing resin served effectively as a relaxing layer for thermal shock.

Then, the semiconductor chip mounted on the mold release carrier with a peel layer was pressed to the uncured first mixture that had been produced beforehand by a hot-press at a temperature of 70° C. and a pressure of 10 kg/cm² for 15 minutes (see FIG. 6C).

By heating at a temperature below the curing temperature, the semiconductor device was buried easily in the uncured first mixture. Furthermore, although the uncured first mixture radically flowed, neither distortion nor disconnection of the wiring pattern occurred (see FIG. 6D).

The above-mentioned results show that the use of the second mixture sheet and the uncured first mixture makes it possible to protect a wide range of the wiring pattern easily and to omit the primary molding process of the first mixture, thus simplifying the formation process.

Then, the position of the wiring pattern corresponding to the holes for the inner via conductors were recognized by a method using an X-ray, and the like, through-holes (0.15 mm diameter) for inner via conductors were formed by using a carbon dioxide gas laser (see FIG. 6E).

Figure 6F:
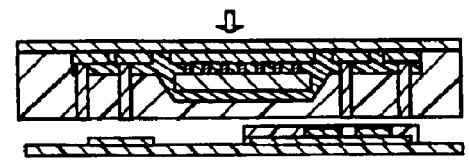
Figure 6G:
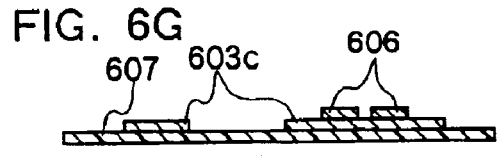
Figure 6H:
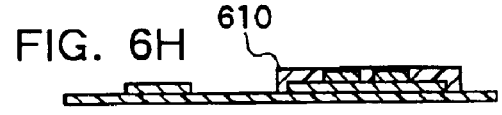
Figure 6I:
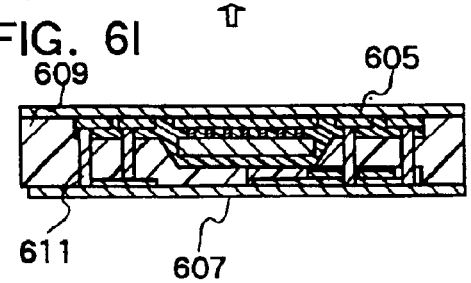

The conductive resin composition was filled in this through-hole by the screen printing method (see FIG. 6F). The conductive resin composition was produced by mixing and kneading 85 weight % of spherical copper particles, 3 weight % of bisphenol A epoxy resin (Epicoat 828 manufactured by Yuka Shell Epoxy), 9 weight % of glycidyl ester based epoxy resin (YD-171 manufactured by Toto Kasei), and 3 weight % of amine adduct hardening agent (MY-24 manufactured by Ajinomoto Co., Inc.).

Then, the copper foil mold release carrier on which the chip capacitor was formed beforehand was superimposed on the first mixture and heated and pressed by a hot-press at a temperature of 170° C. and a pressure of 10 kg/cm² for 30 minutes. Since the chip capacitor has a much smaller volume than that of the semiconductor chip, it can buried into the first mixture further easily. Moreover, the shape of the inner via conductor hardly was distorted. This heating allowed the epoxy resin in the sheet and epoxy resin in the conductive resin composition to be cured, so that the semiconductor device and the copper foils and the plate were strongly connected mechanically. Furthermore, this heating also allowed the conductive resin composition and the copper foils to be connected electrically (inner-via connection) and mechanically.

Figure 6J:
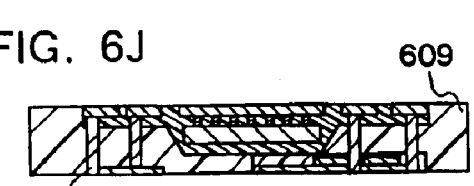

Then, a mold release carrier copper foil with a peel layer was peeled from the plate (see FIG. 6J). The mold release carrier copper foil had a thermal resistance against the heating temperature or more. Furthermore, the rough surface of the copper foil wiring pattern is adhered to the plate and the inner via conductor, and a bright surface is adhered to the mold release carrier copper foil. Therefore, the adhesive strength of the plate and the inner via conductor to the copper foil wiring pattern is greater than the adhesive strength of the mold release carrier copper foil to the copper foil wiring pattern. Therefore, it is possible to peel off only the mold release carrier copper foil.

Furthermore, the region excluding an external lead electrode for evaluation was covered with a resist. The resist was formed into a shape so that the wiring pattern was constrained sufficiently.

Through the above-mentioned processes, the circuit component built-in module was produced.

First, the connection resistance of the bump of the semiconductor device mounted on the mold release carrier and capacitance of the chip capacitor were measured and these values were compared with these measurement values after buried in the substrate (plate). As a result, as in Example 2, it was confirmed that the connection resistance measured by the wiring pattern terminal connected to the bump was substantially the same as the measurement value before buried (i.e. 40 mΩ). Similarly, it was confirmed that the capacitance property of the chip capacitor was not damaged and not changed.

Then, in order to evaluate the reliability of the circuit component built-in module, a solder reflow test and a temperature cycling test were performed. The reflow test was performed for ten times at a maximum temperature of 260° C. for ten seconds by using a belt type reflow tester. The temperature cycling test was performed for 200 cycles at a temperature of −60° C. for 30 minutes after maintained at 125° C. for 30 minutes.

In both solder reflow test and temperature cycling test, no cracks occur in the circuit component built-in module of this Example. Also, no abnormality was found by the use of an ultrasonic test equipment. This shows that the semiconductor, chip capacitor and insulating substrate are adhered strongly. Furthermore, the resistance value of the inner via connection with the conductive resin composition hardly is changed between before and after the test.

Also in this example, the wiring pattern directly on the bump of the semiconductor device was not constrained with a resist, sealing resin, or the like, the bump connection resistance radically increased in several places during the temperature cycling test. This shows the effectiveness of the constrained layer.

In this Example, the resist is formed on the wiring pattern. However, even if the multilayer wiring layer including additional thermosetting resin is laminated, high reliability can be attained in the wiring pattern (including interlayer connection).

Furthermore, according to this configuration, re-wiring is possible, thus broadening the degree of freedom in design.

Example 4

This example refers to a case where the circuit component built-in module is produced by the method described in the tenth embodiment.

In this Example, a semiconductor device and a chip capacitor were used for the circuit components.

First, an organic mold release film (polyphenylene sulfide) having a wiring pattern on which the semiconductor device was flip-chip bonded was prepared. The organic mold release film used herein is provided with holes for injecting a sealing resin made of the second mixture into the connection portion to the semiconductor device (see FIG. 10A). The configuration of the second mixture was the same as in Examples 2 and 3 and it was a mixture of an epoxy-based thermosetting resin including $SiO_2$ as a filler.

The above-mentioned sealing resin was injected from the opposite side of the surface on which the semiconductor device was mounted so as to fill the gap between the semiconductor device and the wiring pattern and the sealing was completed for a short time. According to this method, even if the viscosity is increased by increasing the amount of the filler to 90 weight %, it was possible to fill in the gap. This shows that the second mixture having the constant of liner thermal expansion closer to that of the semiconductor device can be injected.

Next, a slurry mixing 70 weight % of $SiO_2$ filler and 30 weight % of epoxy-based thermosetting resin was produced, and formed into an uncured sheet with low viscosity by a doctor blade method. The thickness of the sheet was set to be about 100 μm.

The entire wiring pattern, together with the mold release film, was covered with this sheet in the same manner as in Example 3, and pressed slightly, then the mold release film was peeled off and heated at 150° C. for about one hour. Alternatively, the mold release film could be peeled off after heating without problems.

Then, the heating and pressing treatment was performed by a hot-press at a pressing temperature of 120° C. and at a pressure of 10 kg/cm$^2$ for 30 minutes. By heating at a temperature below the curing temperature, since the thermosetting resin in the plate is softened, the semiconductor device easily was buried in the plate (see FIG. 10D).

Several plates were produced. Then, they were superimposed on the copper foil wiring patterns in a suitable position.

Then, the heating and pressing treatment was performed by a hot-press at a pressing temperature of 175° C. and at a pressure of 50 kg/cm$^2$ for 60 minutes. This heating and pressing treatment allowed the plurality of plates on which the circuit component was buried and the copper foil wiring pattern to be integrated into one piece. Furthermore, this heating and pressing treatment also allowed an epoxy resin in the plate and the conductive resin composition to cure and to connect the circuit component and the copper foil patterns to the plate strongly. Furthermore, this heating and pressing treatment also allowed the copper foil wiring patterns to the conductive resin composition electrically (inner-via connection) and mechanically. Thus, the circuit component built-in module having a multilayer structure was produced (see FIG. 9A). As to the wiring pattern formed on the principal surface and surface layer, a resist was formed on the region excluding the external lead electrode for evaluation, thus realizing the sufficiently constrained state.

In order to evaluate the reliability of the circuit component built-in module, a solder reflow test and a temperature cycling test were performed under the same conditions as in Example 2. In both the solder reflow test and temperature cycling test, no cracks occurred in the circuit component built-in module of this Example. Also, no abnormality is found by the use of an ultrasonic test equipment. This shows that the semiconductor device and the insulating substrate were adhered strongly. Furthermore, the resistance value of the inner via connection with the conductive resin composition was hardly changed between before and after the test.

Furthermore, since the wiring pattern formed in the internal layer was constrained sufficiently by the substrate itself, even if the resist, sealing resin, etc. was not used, sufficient reliability (by the temperature cycling test, etc.) was attained.

This Example demonstrated that when the multilayer module in which the semiconductor device, etc. was built in was produced, the satisfactory function was obtained and thus the three dimensionally high density mounting was possible.

Example 5

This example refers to a case where the circuit component built-in module is produced by the method described in the second embodiment with reference to FIGS. 11A to 11F.

In this Example, with the use of a semiconductor chip and a chip component as the circuit components, a copper foil wiring pattern having a thickness of 18 μm was formed on a mold release carrier copper foil with a peel layer made of Ni layer. In this case, a fine pattern having L/S of 75 µm/75 µm was employed. The wiring pattern was formed on the copper foil wiring pattern having a thickness of 18 µm by exposure, developing, and etching. Furthermore, the mold release carrier copper foil was provided with a large number of holes in the region excluding the wiring pattern so that the uncured plate having the lowered melting viscosity was eluted.

Other components are the same as in Example 3, and the detailed explanation is not repeated herein.

In this Example, a bare semiconductor chip of 10 mm×10 mm and 0.4 mm thickness was buried in the uncured plate of the first mixture (0.8 mm thickness), which was provided with inner via conductors. As shown in FIG. 11D, the uncured resin was taken out effectively when the chip was buried. As a result, the bare semiconductor chip was buried without radically distorting the inner via conductor formed in 2 mm intervals in the vicinity of the chip. As a comparative example, the semiconductor chip was buried in the mold release carrier (copper foil) provided with no hole, the inner via conductor in the region 5 mm distance from the semiconductor chip was distorted greatly and displaced from the predetermined position.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for producing a circuit component built-in module, comprising:

placing a circuit component on a first wiring pattern formed on one principal surface of a base material for connection therebetween and sealing at least a connection portion between the first wiring pattern and the circuit component with a second mixture comprising an inorganic filler and an uncured thermosetting resin;

subsequently, allowing a first mixture comprising an inorganic filler and an uncured thermosetting resin to face the principal surface of the base material on which the circuit component is formed and pressing the base material to bury the circuit component in the first mixture;

wherein the amount of the inorganic filler contained in the first mixture is larger than the amount of the inorganic filler contained in the second mixture.

2. The method for producing a circuit component built-in module according to claim 1, wherein the first mixture comprises 70 weight % to 95 weight % of an inorganic filler and the second mixture comprises 50 weight % to 90 weight % of an inorganic filler.

3. The method for producing a circuit component built-in module-according to claim 1, wherein in sealing, by injecting an uncured second mixture into the connection portion between the first wiring pattern and the circuit component and curing thereof, the connection portion and the side part of the first wiring pattern and the circuit component are sealed.

4. The method for producing a circuit component built-in module according to claim 1, wherein the sealing comprises injecting an uncured second mixture into the connection portion between the first wiring pattern and the circuit component and curing thereof; molding the second mixture into a sheet of the mixture, covering the entire part of the circuit component and the first wiring pattern on the base material with the second mixture sheet; and curing the second mixture sheet by heating and pressing.

5. The method for producing a circuit component built-in module according to claim 1, wherein the sealing comprises injecting an uncured second mixture into the connection portion between the first wiring pattern and the circuit component and the entire part of the first wiring pattern and curing the second mixture.

6. The method for producing a circuit component built-in module according to claim 3, wherein holes are provided on the base material, and wherein the sealing comprises injecting the second mixture via the hole from the opposite surface of the principal surface of the base material on which the circuit component is provided.

7. The method for producing a circuit component built-in module according to claim 1, wherein the first mixture is formed into a plate before the burying.

8. The method for producing a circuit component built-in module according to claim 1, wherein the burying comprises placing the first mixture into a mold, allowing the first mixture in the mold to face the principal surface of the base material on which the circuit component is formed and pressing the base material; and removing the first mixture from the mold.

9. The method for producing a circuit component built-in module according to claim 1, further comprising forming an inner via conductor in the first mixture, and forming a second wiring pattern that connects to the first wiring pattern via the inner via conductor on the surface opposite to the surface of the first mixture on which the circuit component is buried.

10. The method for producing a circuit component built-in module according to claim 9, wherein the forming of the inner via conductor is carried out after the burying, and comprises forming a through-hole for inner via conductor, which reaches the first wiring pattern from the surface of the first mixture opposite to the surface in which the circuit component is buried; and filling a thermosetting conductive substance in the through-hole for the inner via conductor.

11. The method for producing a circuit component built-in module according to claim 10, wherein the conductive substance comprises a conductive resin composition.

12. The method for producing a circuit component built-in module according to claim 10, comprising, before forming the through-hole for the inner via conductor, recognizing the position of the first wiring pattern by X-ray irradiation to determine the position for forming the through-hole for the inner via conductor.

13. The method for producing a circuit component built-in module according to claim 10, further comprising forming a through-hole for thermal via conductor in the first mixture, before burying, in forming the inner via conductor, a conductive substance is filled in the through-hole for the inner via conductor and at the same time, a thermal conductive substance is filled in the through-hole for the thermal via conductor.

14. The method for producing a circuit component built-in module according to claim 13, wherein the thermal conductive substance to be filled in the through-hole for a thermal via conductor and the conductive substance to be filled in the through-hole for the inner via conductor comprise a metal particle and a thermosetting resin, and the content of the metal particles of the thermal conductive substance to be filled in the through-hole for the thermal via conductor is higher than the content of the metal particles of the conductive substance to be filled in the through-hole for the inner via conductor.

15. The method for producing a circuit component built-in module according to claim 13, wherein the diameter of the through-hole for the thermal via conductor is larger than the diameter of the through-hole for the inner via conductor.

16. The method for producing a circuit component built-in module according to claim 1, wherein a mold release carrier is used for the base material.

17. The method for producing a circuit component built-in module according to claim 16, wherein the mold release carrier is an organic film.

18. The method for producing a circuit component built-in module according to claim 16, wherein the mold release carrier is a metal foil.

19. The method for producing a circuit component built-in module according to claim 18, further comprising forming a peel layer on the metal foil before forming the first wiring pattern on the meal foil.

20. The method for producing a circuit component built-in module according to claim 16, wherein the inner via conductor is formed before burying, and wherein the mold release carrier is provided with one or a plurality of holes that serve as an ejecting hole for the first mixture in burying.

21. The method for producing a circuit component built-in module according to claim 1, wherein the multilayer wiring substrate is used for the base material.

22. The method for producing a circuit component built-in module according to claim 21, wherein the multilayer wiring substrate is a ceramic multilayer wiring substrate.

23. The method for producing a circuit component built-in module according to claim 9, wherein the forming of the second wiring pattern is performed after forming the inner via conductor, and comprises laminating a metal foil on the surface of the first mixture opposite to the surface on which the circuit component is buried, heating at a temperature where the thermosetting resin of the first and second mixtures and the conductive substance of the inner via conductor are cured; and forming the metal foil into the second wiring pattern.

24. The method for producing a circuit component built-in module according to of claim 9, wherein forming the second wiring pattern is performed after forming the inner via conductor, and comprises forming the second wiring pattern on one principal surface of a mold release carrier for the second wiring pattern, allowing the mold release carrier to face the principal surface on which the second wiring pattern is formed to the surface of the first mixture opposite to the surface on which the circuit component is formed and pressing the mold release carrier; heating at the temperature where the thermosetting resin of the first and second mixtures and the conductive substance of the inner via conductor are cured; and peeling the mold release carrier off.

25. The method for producing a circuit component built-in module according to claim 1, further comprising forming a protective film on a region excluding an external lead electrode on the first wiring pattern.

26. The method for producing a circuit component built-in module according to claim 25, wherein a resin is used for a material of the protective film.

27. The method for producing a circuit component built-in module according to claim 25, wherein a resist is used for a material of the protective film.

28. The method for producing a circuit component built-in module according to claim 1, wherein the first wiring pattern is formed of a copper foil.

29. The method for producing a circuit component built-in module according to claim 9, wherein the second wiring pattern is formed of a copper foil.

30. The method for producing a circuit component built-in module according to claim 28, further comprising forming at least one layer of a metal selected from the group consisting of Au, Sn, Pb, and Ni by electrolytic plating on the wiring pattern formed of a copper foil.

31. The method for producing a circuit component built-in module according to claim 1, wherein after forming the inner via conductor on a plate obtained by sealing and burying, the base material is peeled off to produce circuit component built-in substrate; laminating a plurality of the circuit component built-in substrate to produce a multilayer circuit component built-in substrate, and forming a second wiring pattern on the principal surface of the multilayer circuit component built-in substrate on which the first wiring pattern is not formed.

* * * * *